(12) United States Patent
Frodis

(10) Patent No.: US 11,973,301 B2
(45) Date of Patent: *Apr. 30, 2024

(54) PROBES HAVING IMPROVED MECHANICAL AND/OR ELECTRICAL PROPERTIES FOR MAKING CONTACT BETWEEN ELECTRONIC CIRCUIT ELEMENTS AND METHODS FOR MAKING

(71) Applicant: Microfabrica Inc., Van Nuys, CA (US)

(72) Inventor: Uri Frodis, Los Angeles, CA (US)

(73) Assignee: Microfabrica Inc., Van Nuys, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/680,211

(22) Filed: Feb. 24, 2022

(65) Prior Publication Data

US 2024/0097390 A1 Mar. 21, 2024

Related U.S. Application Data

(63) Continuation-in-part of application No. 16/584,863, filed on Sep. 26, 2019, now abandoned.

(Continued)

(51) Int. Cl.
*G01R 1/067* (2006.01)
*H01R 13/03* (2006.01)
(Continued)

(52) U.S. Cl.
CPC ............. *H01R 43/16* (2013.01); *G01R 1/067* (2013.01); *H01R 13/03* (2013.01); *H01R 13/24* (2013.01); *C25D 5/022* (2013.01)

(58) Field of Classification Search
CPC ............ G01R 1/06716; G01R 1/06744; G01R 31/26; G01R 3/00; G01R 1/07378;
(Continued)

(56) References Cited

U.S. PATENT DOCUMENTS 4,027,935 A 6/1977 Byrnes et al.
4,116,523 A 9/1978 Coberly et al.
(Continued)

FOREIGN PATENT DOCUMENTS

EP 0897655 B1 7/2000
JP 2734412 B2 3/1998
(Continued)

OTHER PUBLICATIONS

(01) Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161-168.

(Continued)

*Primary Examiner* — Vinh P Nguyen
(74) *Attorney, Agent, or Firm* — Perkins Coie LLP

(57) ABSTRACT

Embodiments are directed to microscale and millimeter scale multi-layer structures (e.g. probe structures for making contact between two electronic components for example in semiconductor wafer and chip and electronic component test applications). Some embodiments of the invention provide structures that include a core and shell on at least one layer where the layer including the shell is formed from at least one core material and at least one shell material wherein the shell material is different from a shell material or a single structural material on at least one of an immediately preceding layer or an immediately succeeding layer and wherein the core material is different from any core material on at least one of an immediately preceding layer or an immediately succeeding layer.

20 Claims, 14 Drawing Sheets

Related U.S. Application Data

(60) Provisional application No. 62/737,005, filed on Sep. 26, 2018.

(51) Int. Cl.
*H01R 13/24* (2006.01)
*H01R 43/16* (2006.01)
*C25D 5/02* (2006.01)

(58) Field of Classification Search
CPC ............ G01R 1/07342; G01R 1/06711; G01R 31/2889; G01R 1/07314; G01R 31/2884; G01R 1/06761; G01R 1/0466; G01R 1/073; G01R 31/2863; G01R 1/067; G01R 1/06733; G01R 1/06738; G01R 1/06755; G01R 1/07307; G01R 1/0408; G01R 1/0416; G01R 31/28; G01R 31/2831; G01R 1/04; G01R 1/0675; G01R 1/06772; H01R 43/16; H01R 13/2414; H01R 13/24; H01R 13/2464; H01R 13/02; H01R 13/2492; H01L 24/83; H01L 22/00; H01L 2924/15312; H01L 24/29; H01L 24/82; H01L 2224/11; H01L 2224/83192; H01L 2224/73215; H01L 2224/0231; H01L 23/49838; H01L 2224/1308; H01L 2224/24227; H01L 2224/13083; H01L 23/49822; H01L 2224/83191; H01L 23/544; H01L 2224/05082; H01L 24/78; H01L 21/7688; H01L 2224/111
See application file for complete search history.

(56) References Cited

U.S. PATENT DOCUMENTS

| | | |
|---|---|---|
| 4,737,114 A | 4/1988 | Yaegashi |
| 4,773,877 A | 9/1988 | Kruger et al. |
| 4,821,411 A | 4/1989 | Yaegashi |
| 4,952,272 A | 8/1990 | Okino et al. |
| 5,177,438 A | 1/1993 | Littlebury et al. |
| 5,286,208 A | 2/1994 | Matsuoka |
| 5,321,685 A | 6/1994 | Nose et al. |
| 5,476,211 A | 12/1995 | Khandros |
| 5,513,430 A | 5/1996 | Yanof et al. |
| 5,599,194 A | 2/1997 | Ozawa et al. |
| 5,605,614 A | 2/1997 | Bornand |
| 5,811,982 A | 9/1998 | Beaman et al. |
| 5,865,641 A | 2/1999 | Swart et al. |
| 5,892,223 A | 4/1999 | Karpov et al. |
| 5,917,707 A | 6/1999 | Khandros et al. |
| 5,952,843 A | 9/1999 | Vinh |
| 5,967,856 A | 10/1999 | Meller |
| 5,994,152 A | 11/1999 | Khandros et al. |
| 6,043,563 A | 3/2000 | Eldridge et al. |
| 6,184,053 B1 | 2/2001 | Eldridge et al. |
| 6,190,181 B1 | 2/2001 | Affolter et al. |
| 6,208,155 B1 | 3/2001 | Barabi et al. |
| 6,218,203 B1 | 4/2001 | Khoury et al. |
| 6,250,933 B1 | 6/2001 | Khoury et al. |
| 6,255,126 B1 | 7/2001 | Mathieu et al. |
| 6,264,477 B1 | 7/2001 | Smith et al. |
| 6,268,015 B1 | 7/2001 | Mathieu et al. |
| 6,299,458 B1 | 10/2001 | Yamagami et al. |
| 6,329,827 B1 | 12/2001 | Beaman et al. |
| 6,336,269 B1 | 1/2002 | Eldridge et al. |
| 6,358,097 B1 | 3/2002 | Peters |
| 6,359,455 B1 | 3/2002 | Takekoshi |
| 6,414,501 B2 | 7/2002 | Kim et al. |
| 6,426,638 B1 | 7/2002 | Di Stefano |
| 6,471,524 B1 | 10/2002 | Nakano et al. |
| 6,482,013 B2 | 11/2002 | Eldridge et al. |
| 6,491,968 B1 | 12/2002 | Mathieu et al. |
| 6,507,207 B2 | 1/2003 | Nguyen |
| 6,520,778 B1* | 2/2003 | Eldridge ............ H01L 23/49811 324/755.05 |
| 6,560,861 B2 | 5/2003 | Fork et al. |
| 6,573,738 B1 | 6/2003 | Matsuo et al. |
| 6,624,645 B2 | 9/2003 | Haseyama et al. |
| 6,626,708 B2 | 9/2003 | Phillips |
| 6,651,325 B2 | 11/2003 | Lee et al. |
| 6,672,876 B1 | 1/2004 | Takekoshi |
| 6,677,772 B1 | 1/2004 | Faull |
| 6,690,185 B1 | 2/2004 | Khandros et al. |
| 6,720,781 B2 | 4/2004 | Ott et al. |
| 6,758,682 B1 | 7/2004 | Kosmala |
| 6,771,084 B2 | 8/2004 | Di Stefano |
| 6,777,319 B2 | 8/2004 | Grube et al. |
| 6,783,405 B1 | 8/2004 | Yen |
| 6,784,378 B2 | 8/2004 | Zhu et al. |
| 6,787,456 B1 | 9/2004 | Kripesh et al. |
| 6,807,734 B2 | 10/2004 | Eldridge et al. |
| 6,811,406 B2 | 11/2004 | Grube |
| 6,838,894 B2* | 1/2005 | MacIntyre ......... G01R 31/2886 324/755.05 |
| 6,844,748 B2 | 1/2005 | Sato et al. |
| 6,855,010 B1 | 2/2005 | Yen |
| D507,198 S | 7/2005 | Kister |
| 6,935,901 B2 | 8/2005 | Simpson et al. |
| 6,967,492 B2 | 11/2005 | Tsui et al. |
| 6,998,857 B2 | 2/2006 | Terada et al. |
| 7,047,638 B2 | 5/2006 | Eldridge et al. |
| 7,063,541 B2 | 6/2006 | Grube et al. |
| 7,091,729 B2 | 8/2006 | Kister |
| 7,098,540 B1 | 8/2006 | Mohan et al. |
| 7,126,220 B2 | 10/2006 | Lahiri et al. |
| 7,131,848 B2 | 11/2006 | Lindsey et al. |
| 7,148,709 B2 | 12/2006 | Kister |
| 7,172,431 B2 | 2/2007 | Beaman et al. |
| 7,220,134 B2 | 5/2007 | Goodman et al. |
| 7,256,593 B2 | 8/2007 | Treibergs |
| 7,265,562 B2* | 9/2007 | Chen ................. G01R 1/06733 324/755.07 |
| 7,273,812 B2 | 9/2007 | Kim et al. |
| 7,279,917 B2 | 10/2007 | Williams et al. |
| 7,326,327 B2 | 2/2008 | Armstrong et al. |
| 7,412,767 B2 | 8/2008 | Kim et al. |
| 7,435,102 B2 | 10/2008 | Goodman |
| 7,436,192 B2 | 10/2008 | Kister |
| 7,437,813 B2 | 10/2008 | Tunaboylu et al. |
| 7,446,548 B2 | 11/2008 | Chen |
| 7,449,910 B2 | 11/2008 | Kirby et al. |
| 7,456,642 B2 | 11/2008 | Saulnier et al. |
| 7,462,800 B2 | 12/2008 | Tunaboylu et al. |
| 7,504,839 B2 | 3/2009 | Feigenbaum et al. |
| 7,504,840 B2 | 3/2009 | Arat et al. |
| 7,531,077 B2* | 5/2009 | Cohen ................. G01R 1/0483 205/118 |
| 7,533,462 B2 | 5/2009 | Gleason et al. |
| 7,557,595 B2 | 7/2009 | Chen et al. |
| 7,579,856 B2 | 8/2009 | Khandros et al. |
| 7,583,098 B2 | 9/2009 | Tunaboylu et al. |
| 7,628,620 B2 | 12/2009 | Gritters |
| 7,629,807 B2 | 12/2009 | Hirakawa et al. |
| 7,637,007 B2 | 12/2009 | Tunaboylu et al. |
| 7,638,028 B2 | 12/2009 | Tunaboylu et al. |
| 7,674,112 B2 | 3/2010 | Gritters et al. |
| 7,690,925 B2 | 4/2010 | Goodman |
| 7,721,430 B2 | 5/2010 | Chartarifsky et al. |
| 7,731,546 B2 | 6/2010 | Grube et al. |
| 7,733,101 B2 | 6/2010 | Kister |
| 7,798,822 B2 | 9/2010 | Eldridge et al. |
| 7,808,261 B2 | 10/2010 | Kimoto |
| 7,841,863 B2 | 11/2010 | Mathieu et al. |
| 7,850,460 B2 | 12/2010 | Weiland et al. |
| 7,851,794 B2 | 12/2010 | Hobbs |
| 7,888,958 B2 | 2/2011 | Souma et al. |
| 7,922,544 B2 | 4/2011 | Chung |
| 7,928,751 B2 | 4/2011 | Hsu |
| 7,956,288 B2 | 6/2011 | Kazama et al. |
| 8,012,331 B2 | 9/2011 | Lee et al. |
| 8,111,080 B2 | 2/2012 | Kister |

(56) References Cited

U.S. PATENT DOCUMENTS

| | | | |
|---|---|---|---|
| 8,299,394 | B2 | 10/2012 | Theppakuttai et al. |
| 8,415,963 | B2 | 4/2013 | Kister |
| 8,427,186 | B2 | 4/2013 | McFarland |
| 8,451,017 | B2 | 5/2013 | Gleason et al. |
| 8,613,846 | B2 * | 12/2013 | Wu .................. C25D 1/003 205/118 |
| 8,717,054 | B2 | 5/2014 | Chen et al. |
| 8,717,055 | B2 * | 5/2014 | Chen ............... G01R 1/07342 324/755.07 |
| 8,723,543 | B2 * | 5/2014 | Chen ............... G01R 1/06727 324/755.05 |
| 8,729,916 | B2 | 5/2014 | Chen et al. |
| 8,742,272 | B2 | 6/2014 | English et al. |
| 8,926,379 | B2 | 1/2015 | Vinther |
| 9,030,222 | B2 | 5/2015 | Eldridge et al. |
| 9,052,342 | B2 | 6/2015 | Fan et al. |
| 9,097,740 | B2 | 8/2015 | Kister |
| 9,121,868 | B2 | 9/2015 | Kister |
| 9,244,101 | B2 * | 1/2016 | Cohen .................. C25D 5/02 |
| 9,316,670 | B2 | 4/2016 | Kister |
| 9,476,911 | B2 | 10/2016 | Kister |
| RE46,221 | E | 11/2016 | Kister |
| 9,540,233 | B2 | 1/2017 | Kumar et al. |
| 9,671,429 | B2 | 6/2017 | Wu et al. |
| 9,702,904 | B2 | 7/2017 | Breinlinger et al. |
| 9,878,401 | B1 * | 1/2018 | Veeramani ............ C25D 5/028 |
| 9,972,933 | B2 | 5/2018 | Kimura et al. |
| 10,215,775 | B2 | 2/2019 | Wu et al. |
| 10,416,192 | B2 | 9/2019 | Chen et al. |
| 10,641,792 | B2 | 5/2020 | Wu et al. |
| 10,788,512 | B2 | 9/2020 | Chen et al. |
| 10,877,067 | B2 | 12/2020 | Chen et al. |
| 10,965,053 | B2 * | 3/2021 | Huber .................... H01R 43/16 |
| 11,131,690 | B2 | 9/2021 | Crippa |
| 11,262,383 | B1 * | 3/2022 | Smalley ............... G01R 1/0416 |
| 11,630,127 | B2 * | 4/2023 | Wu ....................... B32B 15/01 428/614 |
| 2002/0013085 | A1 | 1/2002 | Boyle et al. |
| 2002/0196038 | A1 | 12/2002 | Okuno et al. |
| 2003/0001606 | A1 | 1/2003 | Bende et al. |
| 2004/0051541 | A1 | 3/2004 | Zhou et al. |
| 2005/0070170 | A1 | 3/2005 | Zhang et al. |
| 2005/0104609 | A1 | 5/2005 | Arat et al. |
| 2005/0176285 | A1 | 8/2005 | Chen et al. |
| 2005/0179458 | A1 | 8/2005 | Chen et al. |
| 2005/0184748 | A1 | 8/2005 | Chen et al. |
| 2005/0189958 | A1 | 9/2005 | Chen et al. |
| 2005/0253606 | A1 | 11/2005 | Kim et al. |
| 2006/0006888 | A1 | 1/2006 | Kruglick et al. |
| 2006/0051948 | A1 | 3/2006 | Kim et al. |
| 2006/0053625 | A1 | 3/2006 | Kim et al. |
| 2006/0170440 | A1 | 8/2006 | Sudin |
| 2006/0238209 | A1 | 10/2006 | Chen et al. |
| 2006/0279301 | A1 | 12/2006 | Treibergs |
| 2007/0144841 | A1 | 6/2007 | Chong et al. |
| 2007/0200576 | A1 | 8/2007 | Laurent et al. |
| 2008/0106280 | A1 | 5/2008 | Chen et al. |
| 2008/0108221 | A1 | 5/2008 | Kim et al. |
| 2008/0111573 | A1 | 5/2008 | Chen et al. |
| 2008/0174332 | A1 | 7/2008 | Arat et al. |
| 2008/0211524 | A1 | 9/2008 | Chen et al. |
| 2009/0066351 | A1 | 3/2009 | Arat et al. |
| 2009/0079455 | A1 | 3/2009 | Gritters |
| 2009/0256583 | A1 | 10/2009 | Chen et al. |
| 2010/0088888 | A1 | 4/2010 | Mathieu et al. |
| 2010/0134131 | A1 | 6/2010 | Chen et al. |
| 2010/0155253 | A1 | 6/2010 | Kim et al. |
| 2010/0176834 | A1 | 7/2010 | Chen et al. |
| 2010/0207654 | A1 | 8/2010 | Hsu |
| 2011/0050263 | A1 | 3/2011 | Sato et al. |
| 2011/0147223 | A1 | 6/2011 | Kumar et al. |
| 2011/0187397 | A1 | 8/2011 | Chen et al. |
| 2011/0187398 | A1 | 8/2011 | Chen et al. |
| 2012/0176122 | A1 | 7/2012 | Hirata et al. |
| 2014/0065893 | A1 | 3/2014 | Vinther |
| 2014/0231264 | A1 | 8/2014 | Chen et al. |
| 2017/0219623 | A1 | 8/2017 | Choi et al. |
| 2020/0064373 | A1 | 2/2020 | Treibergs et al. |
| 2020/0241042 | A1 | 7/2020 | Jeong et al. |

FOREIGN PATENT DOCUMENTS

| | | |
|---|---|---|
| JP | 2001337110 A | 12/2001 |
| JP | 2004156993 A | 6/2004 |
| JP | 2004340617 A | 12/2004 |
| JP | 2004340654 A | 12/2004 |
| JP | 4014040 B2 | 11/2007 |
| JP | 2008032400 A | 2/2008 |
| WO | 2007097559 A1 | 8/2007 |

OTHER PUBLICATIONS

(02) Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

(03) "Microfabrication—Rapid Prototyping's Killer Application", Rapid Prototyping Report, CAD/CAM Publishing, Inc., Jun. 1999, pp. 1-5.

(04) Adam L. Cohen, "3-D Micromachining by Electrochemical Fabrication", Micromachine Devices, Mar. 1999, pp. 6-7.

(05) Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

(06) F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

(07) Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

(08) F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999, pp. 55-60.

(09) Adam L. Cohen, "Electrochemical Fabrication (EFABTM)", Chapter 19 of the MEMS Handbook, edited by Mohamed Gad-El-Hak, CRC Press, 2002, pp. 19/1-19/23.

Hill, Dr. Steve, "An E-FAB Way for Making the Micro World", Materials World is the journal of The Institute of Materials, Sep. 1999, vol. 7, No. 9, pp. 538-539.

Madden, John D0 et al., "Three-Dimensional Microfabrication by Localized, Electrochemical Deposition", J. of Micro. Sys., Mar. 1996, 5(1):24-32.

Madou, Mark J., "Fundamentals of Microfabrication—The Science of Miniaturization", 2nd ed., 2001, pp. 402-412.

Marques, et al., "Fabrication of High-Aspect-Ratio Microstructures on Planar and Nonplanar Surfaces Using a Modified LIGA Process", Dec. 1997, 6(4):329-336.

Weeden, Otto, Keithley Instruments, Inc. "Probe Card Tutorial", pp. 1-40.

* cited by examiner

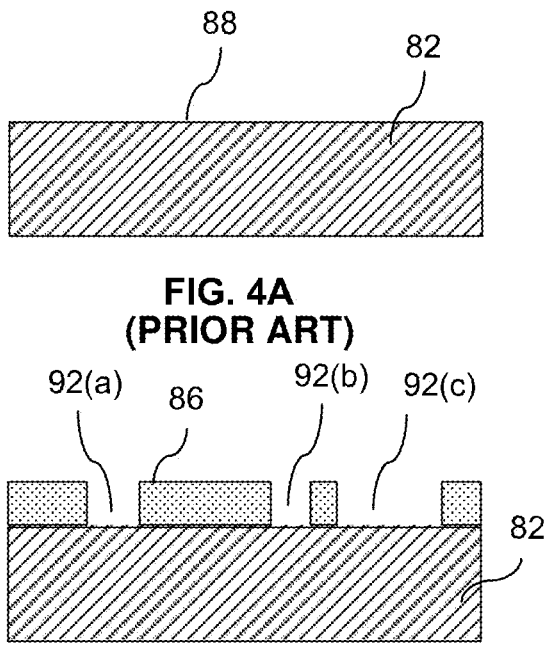
FIG. 4A (PRIOR ART)
FIG. 4C (PRIOR ART)
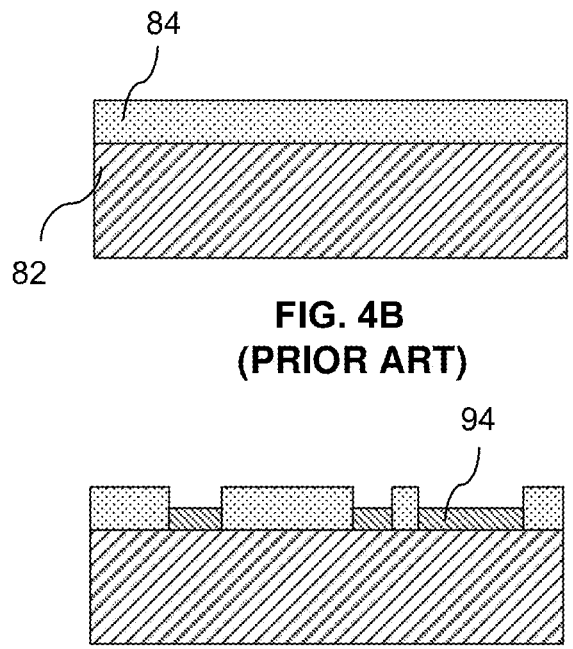
FIG. 4B (PRIOR ART)
FIG. 4D (PRIOR ART)
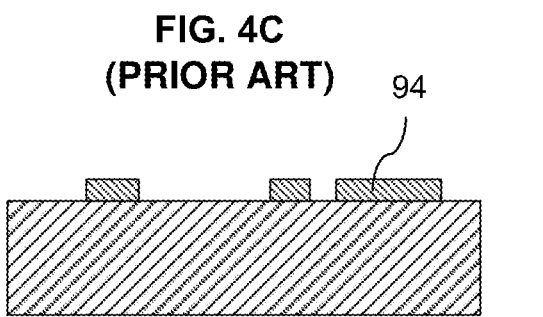
FIG. 4E (PRIOR ART)
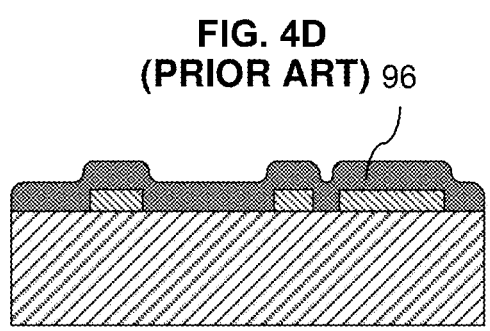
FIG. 4F (PRIOR ART)
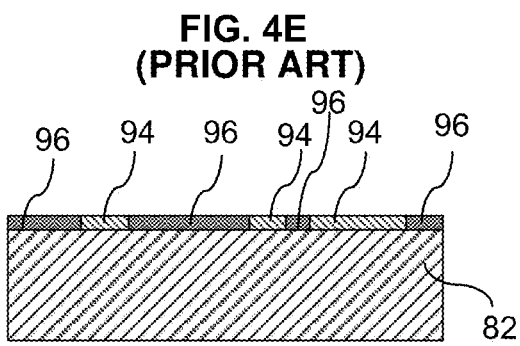
FIG. 4G (PRIOR ART)
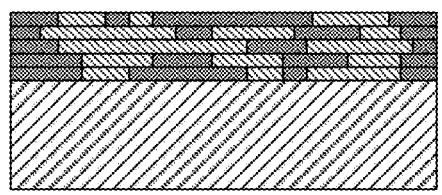
FIG. 4H (PRIOR ART)
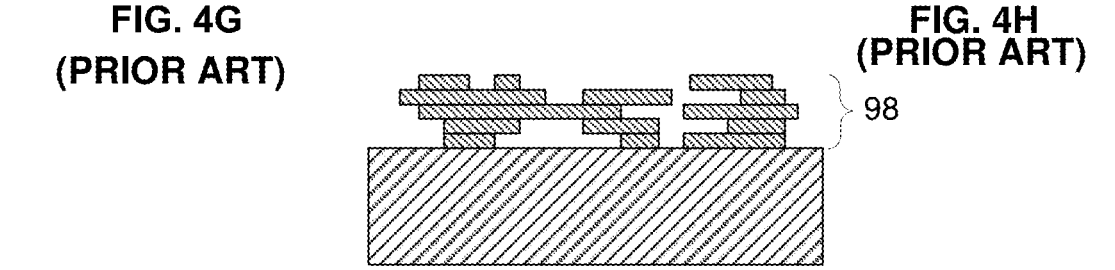
FIG. 4I (PRIOR ART)

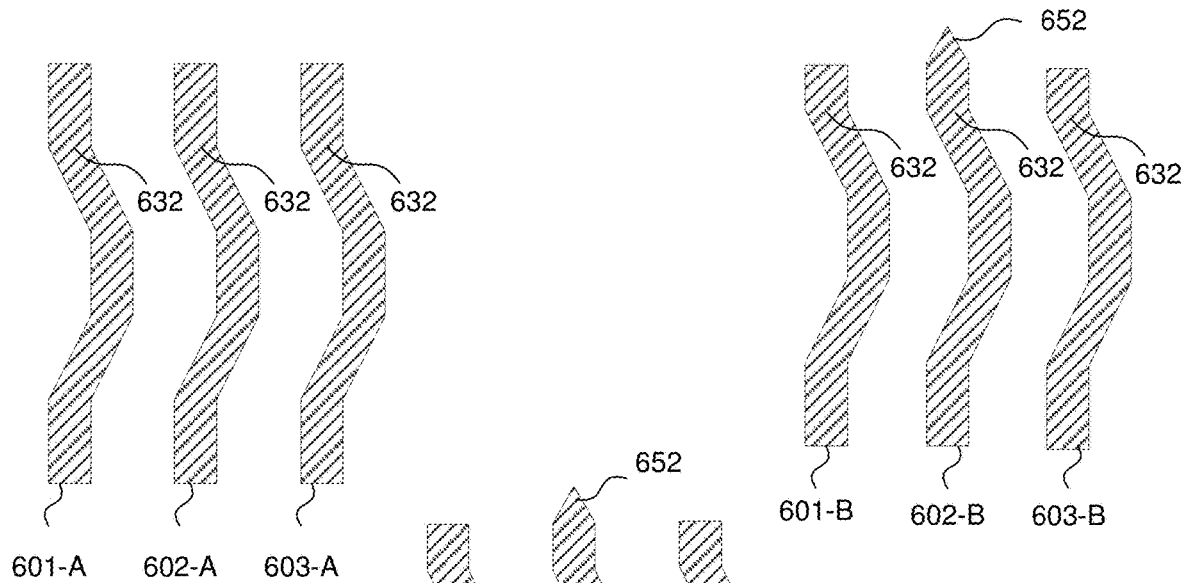
FIG. 6A
FIG. 6B
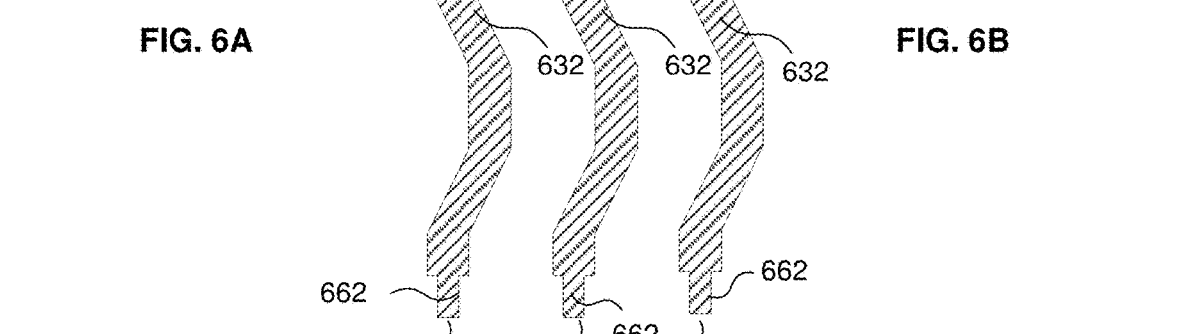
FIG. 6C
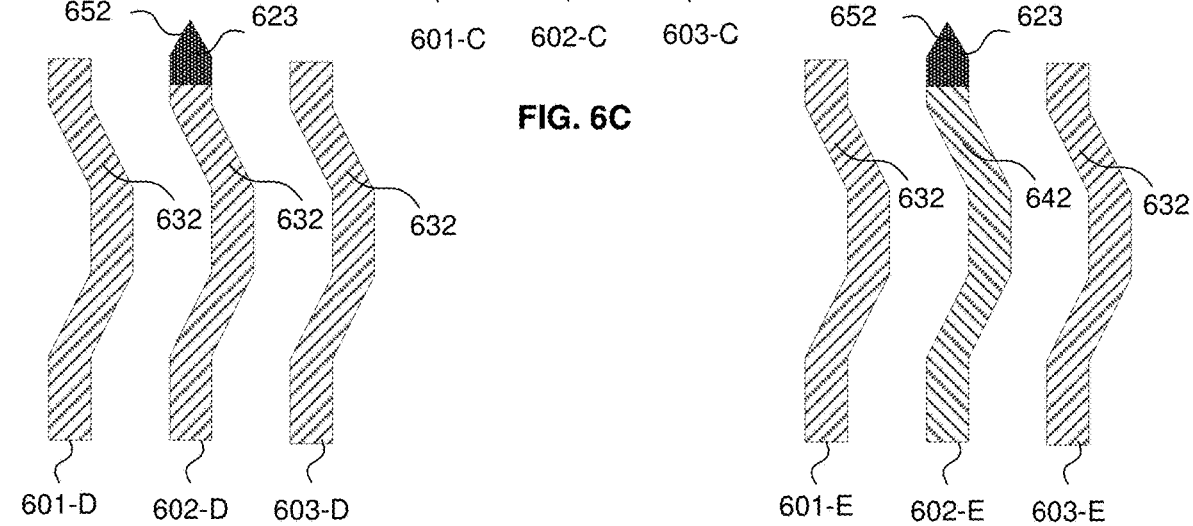
FIG. 6D
FIG. 6E

PROBES HAVING IMPROVED MECHANICAL AND/OR ELECTRICAL PROPERTIES FOR MAKING CONTACT BETWEEN ELECTRONIC CIRCUIT ELEMENTS AND METHODS FOR MAKING

RELATED APPLICATIONS

This application is a continuation-in-part of U.S. patent application Ser. No. 16/584,863, filed on Sep. 26, 2019 which claims the benefit of U.S. Provisional Patent Application No. 62/737,005, filed on Sep. 26, 2018. These referenced applications are incorporated herein by reference as if set forth in full herein.

FIELD OF THE INVENTION

The present disclosure relates generally to the field of electrical contacts and more specifically to the field of compliant probes or pins for making electrical contact between electronic circuits (e.g. during wafer level or socket level testing) and even more specifically to such probes or pins formed from a plurality of adhered layers of deposited conductive and possibly dielectric materials and in some embodiments to methods for making such probes or pins using electrochemical, multi-layer, multi-material fabricating methods.

BACKGROUND OF THE INVENTION

Numerous electrical contact probe and pin configurations have been commercially used or previously proposed. Examples of such pins, probes, or methods of making are set forth in the following patents and applications. Each of these is incorporated herein by reference as if set forth in full.

| Patent (U.S. Pat. No.) or Pub (USAP) or App (USA) # | Title |
| --- | --- |
| U.S. Pat. No. 7,265,565 | Cantilever Microprobes for Contacting Electronic Components and Methods for Making Such Probes |
| USAP 2008-0111573 | Pin-Type Probes for Contacting Electronic Circuits and Methods for Making Such Probes |
| USAP 2016-0231356 | Multi-Layer, Multi-Material Micro-Scale and Millimeter-Scale Devices with Enhanced Electrical and/or Mechanical Properties |
| U.S. Pat. No. 9,878,401 | Methods of Forming Parts Using Laser Machining |
| U.S. Pat. No. 9,540,233 | Methods of Forming Three-Dimensional Structures Having Reduced Stress and/or Curvature |

Electrochemical Fabrication:

EFAB and MICA Freeform® are electrochemical fabrication techniques for forming three-dimensional structures from a plurality of adhered layers that have been or are being, respectively, commercially pursued by Microfabrica® Inc. (formerly MEMGen Corporation) of Van Nuys, California.

Various electrochemical fabrication techniques were described in U.S. Pat. No. 6,027,630, issued on Feb. 22, 2000 to Adam Cohen. Some embodiments of this electrochemical fabrication technique allow the selective deposition of a material using a mask that includes a patterned conformable material on a support structure that is independent of the substrate onto which plating will occur. When desiring to perform an electrodeposition using the mask, the conformable portion of the mask is brought into contact with a substrate, but not adhered or bonded to the substrate, while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. such masks have come to be known as INSTANT MASKS™ and the process known as INSTANT MASKING™ or INSTANT MASK™ plating. Selective depositions using conformable contact mask plating may be used to form single selective deposits of material or may be used in a process to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November 1999.

(8) A. Cohen, "Electrochemical Fabrication (EFAB™)", Chapter 19 of The MEMS Handbook, edited by Mohamed Gad-El-Hak, CRC Press, 2002.

(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

An electrochemical deposition process for forming multi-layer structures may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate. Typically, this material is either a structural material or a sacrificial material.
2. Then, blanket depositing at least one additional material by electrodeposition so that the additional deposit covers both the regions that were previously selectively deposited onto, and the regions of the substrate that did not receive any previously applied selective depositions. Typically, this material is the other of a structural material or a sacrificial material.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to an immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed. The removed material is a sacrificial material while the material that forms part of the desired structure is a structural material.

One method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated (the pattern of conformable material is complementary to the pattern of material to be deposited). In such a process, at least one CC mask is used for each unique cross-sectional pattern that is to be plated.

The support for a CC mask may be a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for multiple CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In some implementations, a single structure, part or device may be formed during execution of the above noted steps or in other implementations (i.e. batch processes) multiple identical or different structures, parts, or devices, may be built up simultaneously.

In preparation for performing the selective deposition of the first operation, the conformable portion of the CC mask is placed in registration with and pressed against a selected portion of (1) the substrate, (2) a previously formed layer, or (3) a previously deposited material forming a portion of a layer that is being formed. The pressing together of the CC mask and relevant substrate, layer, or material occurs in such a way that all openings, in the conformable portions of the CC mask contain plating solution. The conformable material of the CC mask that contacts the substrate, layer, or material acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side cut view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6, separated from mask 8, onto which material will be deposited during the process of forming a layer. CC mask plating selectively deposits material 22 onto substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 10.

The CC mask plating process is distinct from a "through-mask" plating process in that in a through-mask plating process the separation of the masking material from the substrate would occur destructively. Furthermore, in a through mask plating process, openings in the masking material are typically formed while the masking material is in contact with and adhered to the substrate. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1G. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the substrate on which plating is to occur (e.g. separate from a three-dimensional (3D) structure that is being formed). CC masks may be formed in a variety of ways, for example, using a photolithographic process. All masks can be generated simultaneously, e.g. prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A-3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source (not shown) for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g., a plaque.

The '630 patent further indicates that the electroplating methods and articles disclosed therein allow fabrication of devices from thin layers of materials such as, e.g., metals, polymers, ceramics, and semiconductor materials. It further indicates that although the electroplating embodiments described therein have been described with respect to the use of two metals, a variety of materials, e.g., polymers, ceramics and semiconductor materials, and any number of metals can be deposited either by the electroplating methods therein, or in separate processes that occur throughout the electroplating method. It indicates that a thin plating base can be deposited, e.g., by sputtering, over a deposit that is insufficiently conductive (e.g., an insulating layer) so as to enable subsequent electroplating. It also indicates that multiple support materials (i.e. sacrificial materials) can be included in the electroplated element allowing selective removal of the support materials.

The '630 patent additionally teaches that the electroplating methods disclosed therein can be used to manufacture elements having complex microstructure and close tolerances between parts. An example is given with the aid of FIGS. 14A-14E of that patent. In the example, elements having parts that fit with close tolerances, e.g., having gaps between about 1-5 um, including electroplating the parts of the device in an unassembled, preferably pre-aligned state. In such embodiments, the individual parts can be moved into operational relation with each other or they can simply fall together. Once together the separate parts may be retained by clips or the like.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal Layers". This patent teaches the formation of metal structure utilizing through mask exposures. A first layer of a primary metal is electroplated onto an exposed plating base to fill a void in a photoresist (the photoresist forming a through mask having a desired pattern of openings), the photoresist is then removed, and a secondary metal is electroplated over the first layer and over the plating base. The exposed surface of the secondary metal is then machined down to a height which exposes the first metal to produce a flat uniform surface extending across both the primary and secondary metals. Formation of a second layer may then begin by applying a photoresist over the first layer and patterning it (i.e. to form a second through mask) and then repeating the process that was used to produce the first layer to produce a second layer of desired configuration. The process is repeated until the entire structure is formed, and the secondary metal is removed by etching. The photoresist is formed over the plating base or previous layer by casting and patterning of the photoresist (i.e. to form voids in the photoresist) by exposure of the photoresist through a patterned mask via X-rays or UV radiation and development of the exposed or unexposed areas.

The '637 patent teaches the locating of a plating base onto a substrate in preparation for electroplating materials onto the substrate. The plating base is indicated as typically involving the use of a sputtered film of an adhesive metal, such as chromium or titanium, and then a sputtered film of the metal that is to be plated. It is also taught that the plating base may be applied over an initial layer of sacrificial material (i.e. a layer or coating of a single material) on the substrate so that the structure and substrate may be detached if desired. In such cases after formation of the structure the sacrificial material forming part of each layer of the structure may be removed along with the initial sacrificial layer to free the structure. Substrate materials mentioned in the '637 patent include silicon, glass, metals, and silicon with protected semiconductor devices. A specific example of a plating base includes about 150 angstroms of titanium and about 300 angstroms of nickel, both of which are sputtered at a temperature of 160° C. In another example, it is indicated that the plating base may consist of 150 angstroms of titanium and 150 angstroms of nickel where both are applied by sputtering.

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this new capability and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

A need exists in various fields, including the field of electronic device testing (e.g. testing of integrated circuits at the wafer level, packaged integrated circuits, passive electronic devices prior to packaging, and passive electronic devices after packaging) for miniature devices (e.g. spring probes) having improved characteristics, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

SUMMARY OF THE INVENTION

It is an object of some embodiments of the invention to provide a contact probe with improved electrical properties.

It is an object of some embodiments of the invention to provide a contact probe with improved mechanical properties.

It is an object of some embodiments of the invention to provide methods for fabricating improved probe structures.

It is an object of some embodiments of the invention to provide improved microscale or millimeter scale structures with improved material configurations for one more of electrical or electronic applications, mechanical applications, and/or thermal applications.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object ascertained from the teachings herein. It is not necessarily intended that all objects be addressed by any single aspect of the invention even though that may be the case regarding some aspects.

In a first aspect of the invention a compliant probe for providing an elastic electrical connection between at least two electronic components, includes: (a) a first planarized layer including at least a first structural material; (b) a second planarized layer including at least a second structural material, wherein the second structural material has a relationship with the first planarized layer selected from the group consisting of: (1) the second structural material is directly adhered to the first planarized layer, (2) the second structural material is separated from the first planarized layer by one or more intermediate planarized layers, and (3) the second material is separated from the first planarized layer by one or more depositions of at least one intervening material; (c) a third planarized layer including at least a third structural material, wherein the third structural material has a relationship with the second planarized layer selected from the group consisting of: (1) the third material is directly adhered to the second planarized layer, (2) the third material is separated from the second planarized layer by one or more additional intermediate planarized layers, and (3) the third material is separated from the second planarized layer by one or more depositions of at least one intervening material, wherein the second planarized layer is located between the first and third planarized layers in a layer stacking direction, wherein the second structural material is different from the first structural material and the second structural material is different from the third structural material, wherein the probe is configured to provide an elastic electrical contact element that provides a conductive path along a length of the probe between at least two electronic components, and wherein at least one of the first to third planarized layers includes at least one core structural material and at least one shell structural material, wherein the at least one of the core structural material and the at least one shell structural material of a respective layer corresponds to the respective structural material selected from the group consisting of the first structural material, second structural material, and third structural material while the other of the shell structural material and core structural material is a different material, and wherein the core structural material is laterally surrounded by structural material that is not core structural material on the respective layer and wherein the core structural material extends at least a portion of the axial length of the probe.

Numerous variations of the first aspect of the invention and include, for example: (1) the core structural material being also bounded from above and below along a layer stacking direction by non-core structural material; (2) variation 1 wherein the encapsulation from above and below is direct encapsulation with the core structural material of the respective layer being covered by non-core structural material of an immediately succeeding layer and by an immediately preceding layer; (3) variation 1 wherein the encapsulation from above and below is indirect encapsulation as the core structural of the respective layer is separated from non-core material by at least one additional layer of core material forming part of a layer selected from the group consisting of (a) at least one immediately preceding layer, (b) at least one immediately succeeding layer, and (c) at least one immediately preceding layer and at least one immediately succeeding layer; (4) a contact tip material located at an end of at least one of the layers, wherein the tip material is different from the first, second, and third materials; (5) any of variations 1-4 additionally including a contact tip material located at an end of at least one of the layers, wherein the tip material is different from the first, second, and third materials; (6) the first and third materials include the same material; (7) any of variations 1-5 wherein the first and third materials include the same material; (8) the core material includes a dielectric material; (9) any of variations 1-5 wherein the core material includes a dielectric material; (10) the core material includes a conductive material having a higher conductivity than at least one of the first, second, and third materials; (11) any of variations 1-4 wherein the core material includes a conductive material having a higher conductivity than at least one of the first, second, and third materials; (12) either variation 10 or 11 wherein the core material includes a conductive material having a higher conductivity than each of the first, second and third materials; (13) the core material includes copper; (14) any of variations 1-11 wherein the core material includes copper; (15) the at least one of the first, second, and third materials includes a material selected from the group consisting of: (a) nickel (Ni), (b) copper (Cu), (c) beryllium copper (BeCu), (d) nickel phosphorous (Ni—P), (e) nickel cobalt (NiCo), (f) aluminum copper (Al—Cu), (h) steel, (h) P7 alloy, (i) palladium (Pd), (j) palladium cobalt (PdCo), (k) molybdenum, (l) manganese, (m) brass, (n) chrome, (o) chromium copper (Cr—Cu), and (p) tungsten (W), (q) gold, (r) silver, and (s) a combination of at least two of these materials; (16) any of variations 1-9 wherein the at least one of the first, second, and third materials includes a material selected from the group consisting of: (a) nickel (Ni), (b) copper (Cu), (c) beryllium copper (BeCu), (d) nickel phosphorous (Ni—P), (e) nickel cobalt (NiCo), (f) aluminum copper (Al—Cu), (h) steel, (h) P7 alloy, (i) palladium (Pd), (j) palladium cobalt (PdCo), (k) molybdenum, (l) manganese, (m) brass, (n) chrome, (o) chromium copper (Cr—Cu), and (p) tungsten (W), (q) gold, (r) silver, and (s) a combination of at least two of these materials; (16) any of variations 1-9; (17) the second planarized layer includes a shell structural material and a core structural material and wherein the first and third structural materials and the shell structural material of the second planarized layer include the same material; (18) any of variations 1-11 wherein the second planarized layer includes a shell structural material and a core structural material and wherein the first and third structural materials and the shell structural material of the second planarized layer include the same material; (19) either of variations 4 or 5 wherein the contact tip material includes a metal different from any core structural material; (20) a conformal coating material located on at least portions of the first, second and third planarized layers; (21) any of variations 1-19 additionally including a conformal coating material located on at least portions of the first, second and third planarized layers; (22) either of variations 20 or 21 wherein the conformal coating material includes a dielectric; (23) either of variations 20 wherein the conformal coating material includes a conductive material; (24) the first, second, third, and any intermediate layers includes a number of layers selected from the group consisting of (a) at least 4 layers, (b) at least 5 layers, and (c) at least 6 layers; (25) any of variations 1-23 wherein the first, second, third, and any intermediate layers includes a number of layers selected from the group consisting of (a) at least 4 layers, (b) at least 5 layers, and (c) at least 6 layers; (26) any of variations 1-25 wherein the probe includes at least two layers with cores and shells wherein the at least two layers are separated by an intervening layers; (27) the probe includes at least two layers with cores and shells wherein the at least two layers are joined one to the other; (28) any of variations 1-25 wherein the probe includes at least two layers with cores and shells wherein the at least two layers are joined one to the other; (29) the first, second, third, and any intermediate layers includes a number of layers selected from the group consisting of (a) at least 4 layers, (b) at least 5 layers, and (c) at least 6 layers; (30) any of variations 1-28 wherein the first, second, third, and any intermediate layers includes a number of layers selected from the group consisting of (a) at least 4 layers, (b) at least 5 layers, and (c) at least 6 layers; (31) the probe includes at least two layers with cores and shells wherein the at least two layers are separated by at least one intervening layer; (32) any of variations 1-30 wherein the probe includes at least two layers with cores and shells wherein the at least two layers are separated by at least one intervening layer; (33) the probe includes at least two layers with cores and shells wherein the at least two layers are joined one to the other; (34) any of variations 1-30 wherein the probe includes at least two layers with cores and shells wherein the at least two layers are joined one to the other; (35) the shell structural material on the plurality of successive layer alternates from layer-to-layer; (36) any of variations 1-34 wherein the shell structural material on the plurality of successive layer alternates from layer-to-layer; (37) wherein the core structural material is genuine structural material; (38) any of variations 1-36 wherein the core structural material is genuine structural material; (39) the core structural material is selected from the group consisting of (a) nickel (Ni), (b) copper (Cu), (c) beryllium copper (BeCu), (d) nickel phosphorous (Ni—P), (e) nickel cobalt (NiCo), (f) aluminum copper (Al—Cu), (h) steel, (h) P7 alloy, (i) palladium (Pd), (j) palladium cobalt (PdCo), (k) molybdenum, (l) manganese, (m) brass, (n) chrome, (o) chromium copper (Cr—Cu), and (p) tungsten (W), (q) gold, (r) silver, and (s) a combination of at least two of these materials; (40) any of variations 1-38 wherein the core structural material is selected from the group consisting of (a) nickel (Ni), (b) copper (Cu), (c) beryllium copper (BeCu), (d) nickel phosphorous (Ni—P), (e) nickel cobalt (NiCo), (f) aluminum copper (Al—Cu), (h) steel, (h) P7 alloy, (i) palladium (Pd), (j) palladium cobalt (PdCo), (k) molybdenum, (l) manganese, (m) brass, (n) chrome, (o) chromium copper (Cr—Cu), and (p) tungsten (W), (q) gold, (r) silver, and (s) a combination of at least two of these materials; (41) the core structural material is a functional structural material; (42) any of variations 1-36 wherein the core structural material is a functional structural material; (43) the core material on at least one layer is the same as the non-core material on at least one other layer; (44) any of variations 1-42 wherein the core material on at least one layer is the same as the non-core material on at least one other layer; (45) the core material non-core material on at least two consecutive layers have lateral extends that result in an overlap wherein the overlap is selected from (a) at least one micron, (b) at least 3 microns, (c) at least 5 microns, (d) at least 7 microns, (e) at least 5% of the probe width along a line perpendicular to the layer thickness and the length of the probe, at least 10%, at least 20%, no more than 40%, no more than 30%, no more than 20%; (46) any of variations 1-44 wherein the core material non-core material on at least two consecutive layers have lateral extends that result in an overlap wherein the overlap is selected from (a) at least one micron, (b) at least 3 microns, (c) at least 5 microns, (d) at least 7 microns, (e) at least 5% of the probe width along a line perpendicular to the layer thickness and the length of the probe, at least 10%, at least 20%, no more than 40%, no more than 30%, no more than 20%; (47) a given layer has at least two cores; (48) any of variations 1-44 wherein a given layer has at least two cores; (49) a plurality of layers include more than one core; (50) any of variations 1-48 wherein a plurality of layers include more than one core; (51) at least one shell and corresponding core are formed by a process selected from the group consisting of: (a) using a first mask to form a configuration of shell structural material and then blanket plating to form a configuration of the core structural material; (b) using a first mask to form a configuration of the shell structural material and a second mask to form a configuration of the core structural material; (c) using a first mask to form a configuration of the core structural material and a second mask to form a configuration of the shell structural material; (d) use a first deposit of conductive material to form a pattern into which a thin layer of structural shell material can be formed with both a base region and sidewall regions and then using a deposition to deposit a configuration of core material followed by planarization to set a common level for core structural material and the shell structural material; (3) using a mask to deposit a configuration of core structural material to a height less than a thickness of the layer, and thereafter blanket depositing a shell structural material and then planarizing to set a height for the layer wherein shell structural material caps the core structural material; (f) using a mask to deposit a configuration of core structural material to a height greater than a thickness of the layer, and thereafter blanket depositing a shell structural material and then planarizing to set a height for the layer wherein the core structural material and the shell structural material are trimmed to a substantially common level; (52) any of variations 1-50 wherein at least one shell and corresponding core are formed by a process selected from the group consisting of: (a) using a first mask to form a configuration of shell structural material and then blanket plating to form a configuration of the core structural material; (b) using a first mask to form a configuration of the shell structural material and a second mask to form a configuration of the core structural material; (c) using a first mask to form a configuration of the core structural material and a second mask to form a configuration of the shell structural material; (d) use a first deposit of conductive material to form a pattern into which a thin layer of structural shell material can be formed with both a base region and sidewall regions and then using a deposition to deposit a configuration of core material followed by planarization to set a common level for core structural material and the shell structural material; (e) using a mask to deposit a configuration of core structural material to a height less than a thickness of the layer, and thereafter blanket depositing a shell structural material and then planarizing to set a height for the layer wherein shell structural material caps the core structural material; (f) using a mask to deposit a configuration of core structural material to a height greater than a thickness of the layer, and thereafter blanket depositing a shell structural material and then planarizing to set a height for the layer wherein the core structural material and the shell structural material are trimmed to a substantially common level; and (53) at least one non-core structural material on each of two adjacent layers are different from each other and where at least one of the two adjacent layers includes a core and core material that is different from its respective non-core structural material; (54) variation 53 additionally includes at least one additional layer adjacent to the one of the two adjacent layers wherein a non-core structural material on the at least one additional adjacent layer is different from a non-core structural material of the one of the two adjacent layers; (55) variation 54 wherein the at least one additional layer includes at least one core including a core material which is different from the core material of the one of the two adjacent layers; and (56) wherein the probes are micro-scale devices or millimeter scale devices.

In a second aspect of the invention a method for forming a compliant probe for providing an elastic electrical connection between at least two electronic components, includes: (a) forming a first planarized layer including at least a first structural material; (b) forming a second planarized layer including at least a second structural material, wherein the second structural material has a relationship with the first planarized layer selected from the group consisting of: (1) the second structural material is directly adhered to the first planarized layer, (2) the second structural material is separated from the first planarized layer by one or more intermediate planarized layers, and (3) the second material is separated from the first planarized layer by one or more depositions of at least one intervening material; (c) forming a third planarized layer including at least a third structural material, wherein the third structural material has a relationship with the second planarized layer selected from the group consisting of: (1) the third material is directly adhered to the second planarized layer, (2) the third material is separated from the second planarized layer by one or more additional intermediate planarized layers, and (3) the third material is separated from the second planarized layer by one or more depositions of at least one intervening material, wherein the second planarized layer is located between the first and third planarized layers in a layer stacking direction, wherein the second structural material is different from the first structural material and the second structural material is different from the third structural material, wherein the probe is configured to provide an elastic electrical contact element that provides a conductive path along a length of the probe between at least two electronic components, and wherein at least one of the first to third planarized layers includes at least one core structural material and at least one shell structural material, wherein the at least one of the core structural material and the at least one shell structural material of a respective layer corresponds to the respective structural material selected from the group consisting of the first structural material, second structural material, and third structural material while the other of the shell structural material and core structural material is a different material, and wherein the core structural material is laterally surrounded by structural material that is not core structural material on the respective layer and wherein the core structural material extends at least a portion of the axial length of the probe.

Numerous variations of the second aspect of the invention exist and include for example at least one shell and corresponding core being formed by a process selected from the group consisting of: (1) using a first mask to form a configuration of shell structural material and then blanket plating to form a configuration of the core structural material; (2) using a first mask to form a configuration of the shell structural material and a second mask to form a configuration of the core structural material; (3) using a first mask to form a configuration of the core structural material and a second mask to form a configuration of the shell structural material; (4) use a first deposit of conductive material to form a pattern into which a thin layer of structural shell material can be formed with both a base region and sidewall regions and then using a deposition to deposit a configuration of core material followed by planarization to set a common level for core structural material and the shell structural material; (5) using a mask to deposit a configuration of core structural material to a height less than a thickness of the layer, and thereafter blanket depositing a shell structural material and then planarizing to set a height for the layer wherein shell structural material caps the core structural material; (5) using a mask to deposit a configuration of core structural material to a height greater than a thickness of the layer, and thereafter blanket depositing a shell structural material and then planarizing to set a height for the layer wherein the core structural material and the shell structural material are trimmed to a substantially common level. Other variations of the second aspect include counterparts to the variations of the first aspect of the invention.

In a third aspect of the invention, a structure, comprises: (a) a first planarized layer comprising at least a first structural material; (b) a second planarized layer comprising at least a second structural material, wherein the second structural material has a relationship with the first planarized layer selected from the group consisting of: (1) the second structural material is directly adhered to the first planarized layer, (2) the second structural material is separated from the first planarized layer by one or more intermediate planarized layers, and (3) the second material is separated from the first planarized layer by one or more depositions of at least one intervening material; (c) a third planarized layer comprising at least a third structural material, wherein the third structural material has a relationship with the second planarized layer selected from the group consisting of: (1) the third material is directly adhered to the second planarized layer, (2) the third material is separated from the second planarized layer by one or more additional intermediate planarized layers, and (3) the third material is separated from the second planarized layer by one or more depositions of at least one intervening material, wherein the second planarized layer is located between the first and third planarized layers in a layer stacking direction, wherein the second structural material is different from the first structural material and the second structural material is different from the third structural material, and wherein at least one of the first to third planarized layers comprises at least one core structural material and at least one shell structural material, wherein the at least one of the core structural material and the at least one shell structural material of a respective layer corresponds to the respective structural material selected from the group consisting of the first structural material, second structural material, and third structural material while the other of the shell structural material and core structural material is a different material, and wherein the core structural material is laterally surrounded by structural material that is not core structural material on the respective layer and wherein the core structural material extends at least a portion of the axial length of the structure.

Number variations of the third aspect exist and include, for example, the variations noted for the first aspect mutatis mutandis.

Other aspects of the invention will be understood by those of skill in the art upon review of the teachings herein. Other aspects of the invention may involve combinations of the above noted aspects of the invention. Other aspects of the invention may involve apparatus or methods used in creating or testing one or more of the compliant probe aspects set forth above. These other aspects of the invention may provide various combinations of the aspects presented above as well as provide other configurations, structures, functional relationships, and processes that have not been specifically set forth above but are taught by other specific teachings set forth herein or by the teachings set forth herein as a whole. Other aspects of the invention may provide arrays of such probes such as probes bonded to substrates, probes set into one or more guide plates, or in arrays made using a combination of these techniques.

Other aspects of the invention may provide probe structures with cores for various applications such as wafer test, burn-in, socket test, or permanent electronic contact applications or to structures that are not probes (e.g. medical devices, needles, springs, thermal contact or management devices, or other microscale or millimeter scale devices).

BRIEF DESCRIPTION OF THE DRAWINGS

FIGS. 4A-4F schematically depict the formation of a first layer of a structure using adhered mask plating where the blanket deposition of a second material overlays both the openings between deposition locations of a first material and the first material itself.

FIG. 4G depicts the completion of formation of the first layer resulting from planarizing the deposited materials to a desired level.

FIGS. 4H and 4I respectively depict the state of the process after formation of the multiple layers of the structure and after release of the structure from the sacrificial material.

FIGS. 6A-6E illustrate five different example three-layer probe configurations, with each figure providing top views of structural material for 1$^{st}$ to 3$^{rd}$ layers for a single probe example.

DETAILED DESCRIPTION OF PREFERRED EMBODIMENTS

Electrochemical Fabrication in General

Figure 1A:
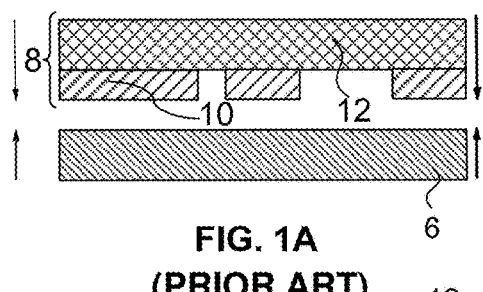
FIGS. 1A-1C schematically depict side views of various stages of a CC mask plating process, while FIGS. 1D-1G schematically depict side views of various stages of a CC mask plating process using a different type of CC mask.
Figure 1B:
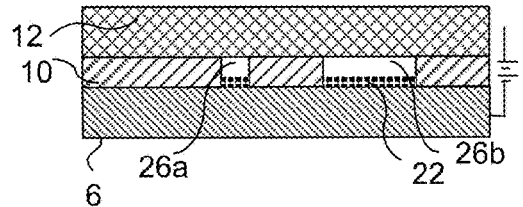
Figure 1C:
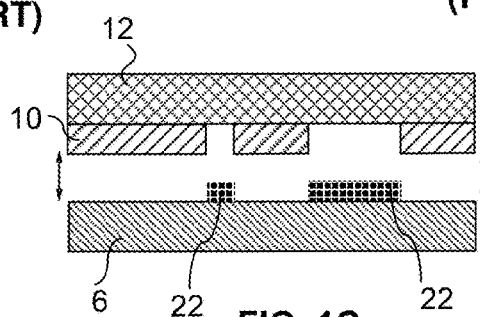
Figure 1D:
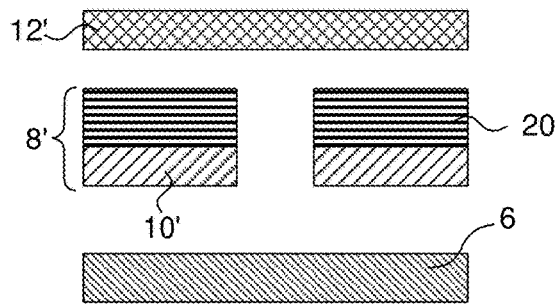
Figure 1E:
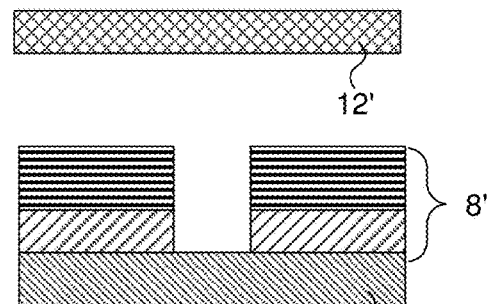
Figure 1F:
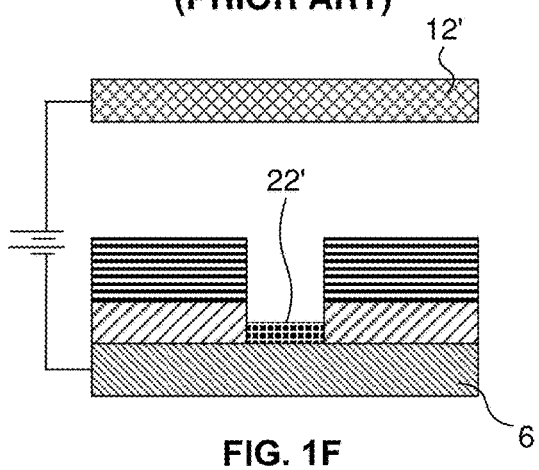
Figure 1G:
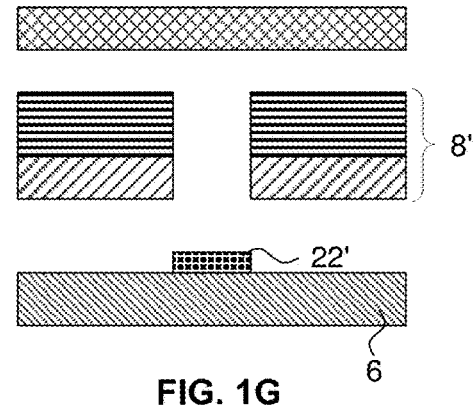
Figure 2A:
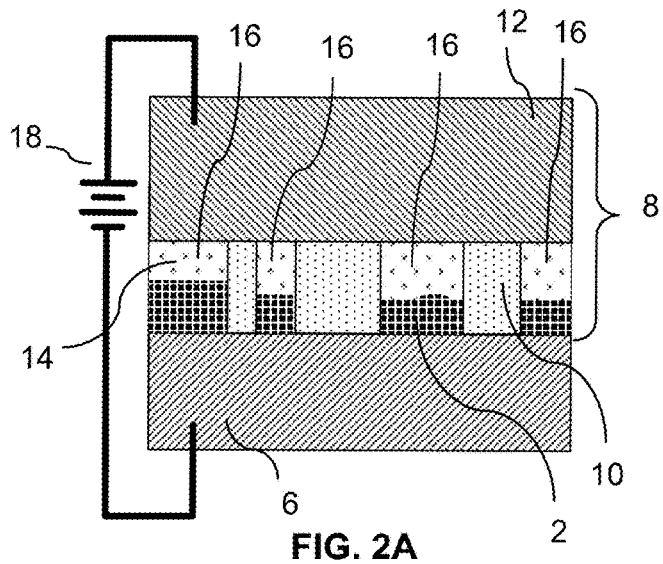
FIGS. 2A-2F schematically depict side views of various stages of an electrochemical fabrication process as applied to the formation of a particular structure where a sacrificial material is selectively deposited while a structural material is blanket deposited.
Figure 2B:
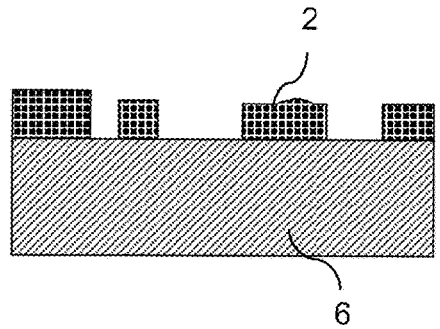
Figure 2C:
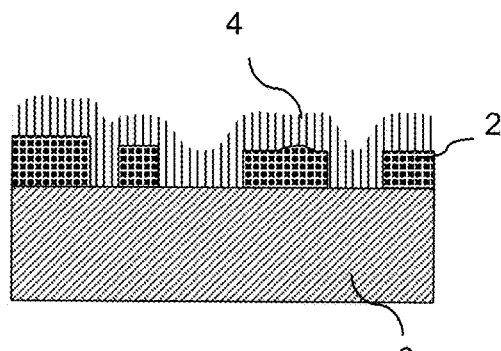
Figure 2D:
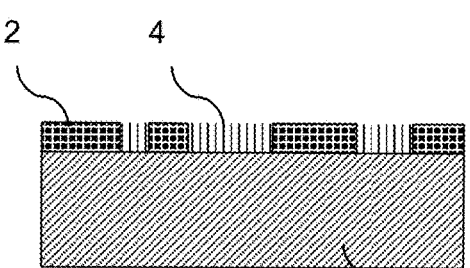
Figure 2E:
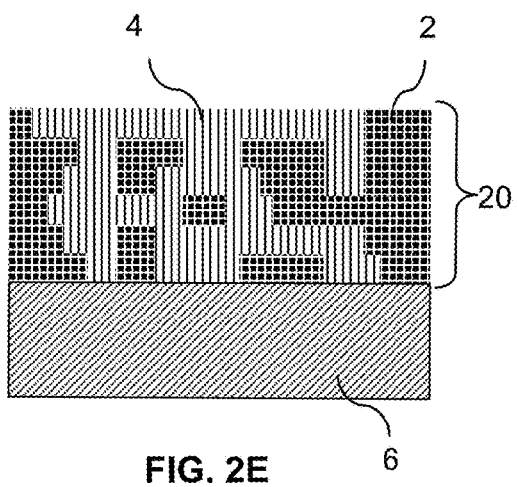
Figure 2F:
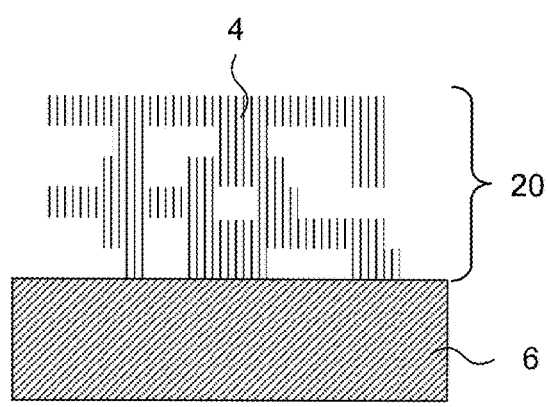
Figure 3A:
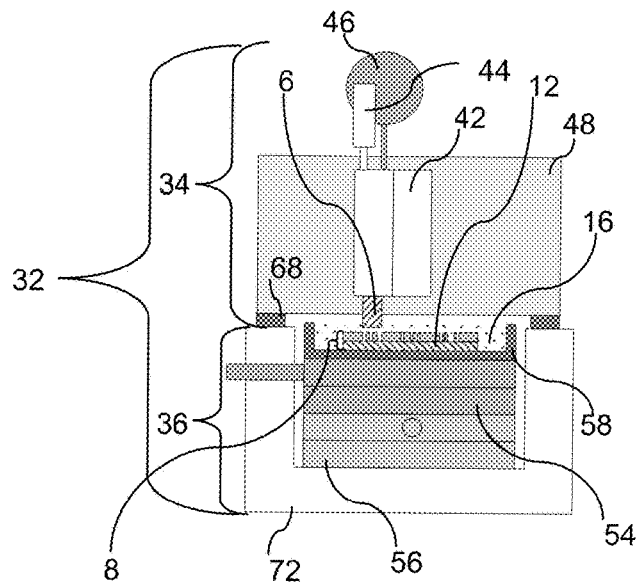
FIGS. 3A-3C schematically depict side views of various example subassemblies that may be used in manually implementing the electrochemical fabrication method depicted in FIGS. 2A-2F.
Figure 3B:
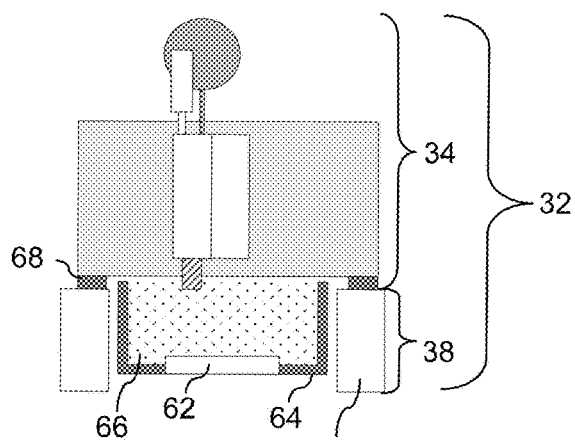
Figure 3C:
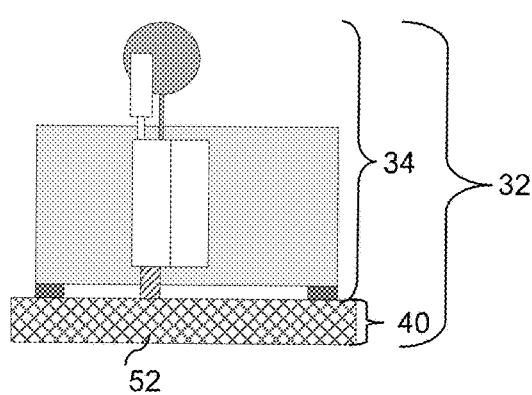

FIGS. 1A-1G, 2A-2F, and 3A-3C illustrate various features of one form of electrochemical fabrication. Other electrochemical fabrication techniques are set forth in the '630 patent referenced above, in the various previously incorporated publications, in various other patents and patent applications incorporated herein by reference. Still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

FIGS. 4A-4I illustrate side views of various states in an alternative multi-layer, multi-material electrochemical fabrication process. FIGS. 4A-4G illustrate various stages in the formation of a single layer of a multi-layer fabrication process where a second metal is deposited on a first metal as well as in openings in the first metal so that the first and second metal form part of the layer. In FIG. 4A a side view of a substrate 82 having a surface 88 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D a metal 94 (e.g. nickel) is shown as having been electroplated into the openings 92(a)-92(c). In FIG. 4E the photoresist has been removed (i.e. chemically stripped) from the substrate to expose regions of the substrate 82 which are not covered with the first metal 94. In FIG. 4F a second metal 96 (e.g. silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure is shown where each layer consists of two materials. For most applications, one of these materials is removed as shown in FIG. 4I to yield a desired 3-D structure 98 (e.g. component or device).

Figure 5A:
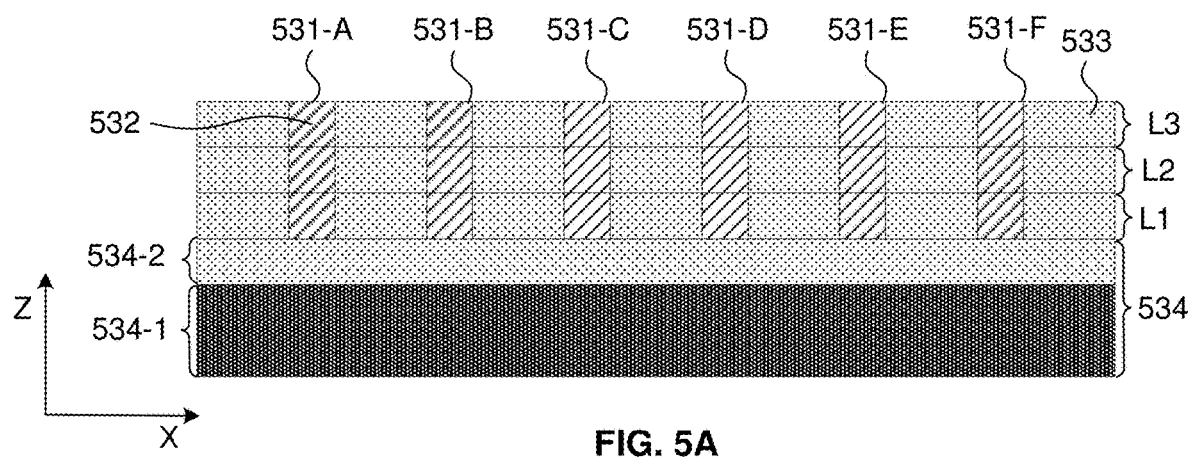
FIGS. 5A and 5B provide a side cut view (FIG. 5A) of a plurality of three-layer parts and a top view (FIG. 5B) of the last layer of those parts respectively, wherein the parts are a plurality of example probes being formed in a batch, multi-layer, multi-material fabrication process.
Figure 5B:
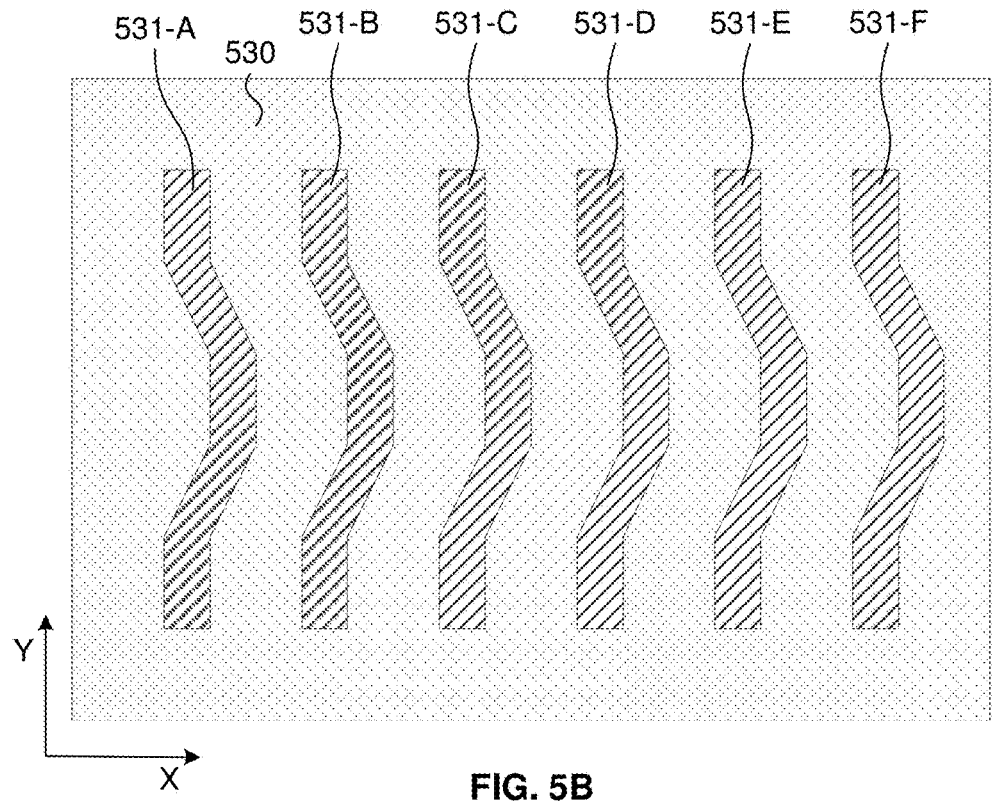

FIGS. 5A-5D help illustrate how the fabrication processes noted above and elsewhere herein can be applied in a batch manner to the formation of a plurality of multi-layer probe structures. FIG. 5A provides a side cut view of a plurality of example parts 531-A to 531-F formed from a single structural material 532 on each of three layers L1, L2 and L3. In addition to the structural material L1-L3 were also formed with a sacrificial material 533. Layer 1 (L1) of the parts is formed on a release layer 534-2 that was formed on a substrate material 534-1 wherein together 534-1 and 534-2 may be considered a complete substrate 534. FIG. 5B provides a top view of the formed parts 531-A to 531-F wherein lateral regions (or X and Y regions) of individual parts can be seen. The substrate 534 (more particularly 534-1) may be considered to be reusable for building other parts after reformation of a release layer 534-2 that may be removed or become damaged during the fabrication of a previous set of parts or during the release of those parts from the substrate.

Figure 5C:
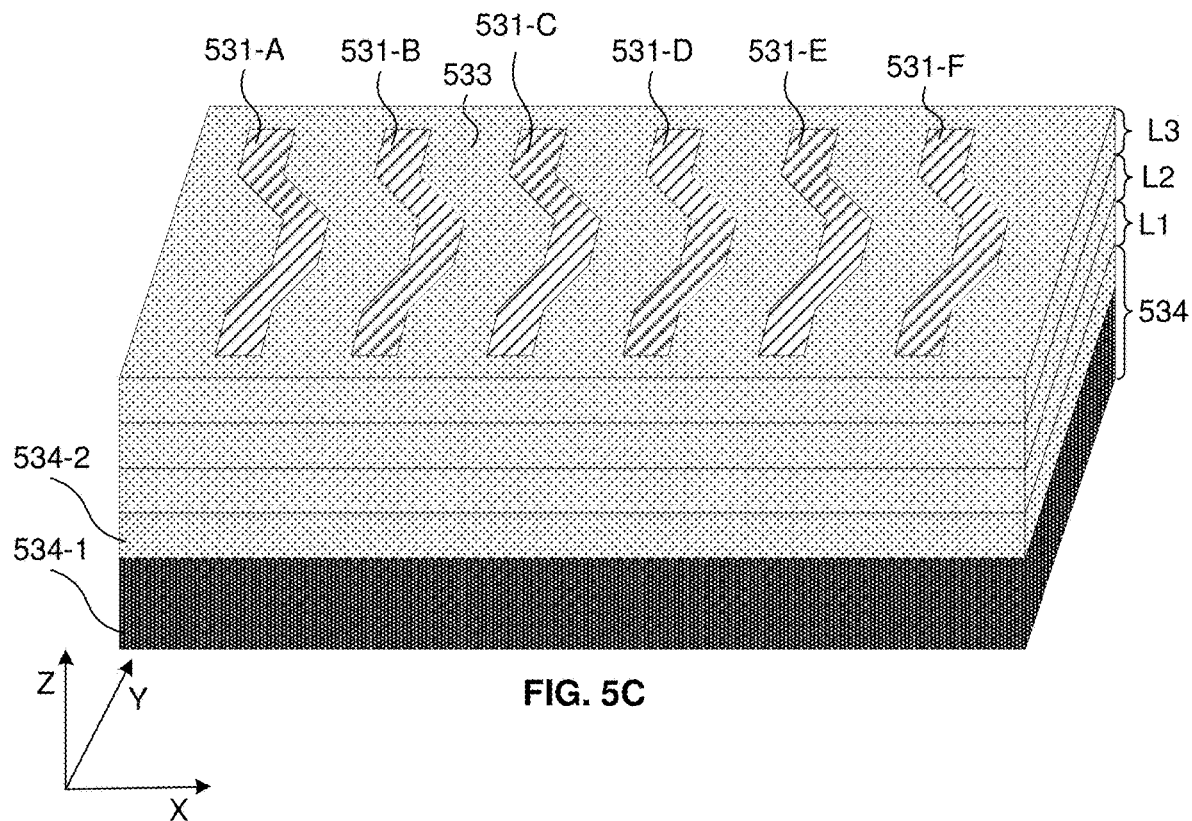
FIGS. 5C and 5D provide isometric views of the batch fabricated probe parts of FIGS. 5A and 5B wherein the parts are shown prior to release (FIG. 5C) and after release (FIG. 5D).
Figure 5D:
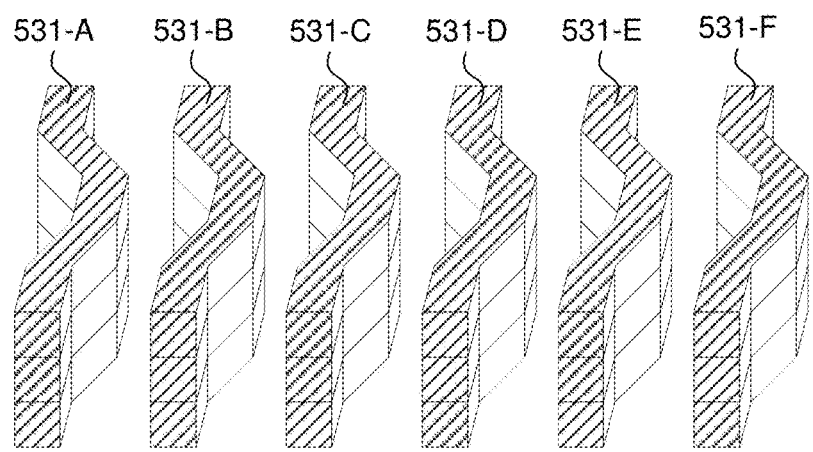

FIGS. 5C and 5D provide perspective views of the batch fabricated parts of FIGS. 5A and 5B. In FIG. 5C the parts are shown in the same process state as that of FIGS. 5A and 5B (i.e. prior to release of the parts from the sacrificial material 533 and from the substrate 534-1). FIG. 5D shows the six three-layer parts 531-A to 531-F after release but still in the same relative positions.

Various embodiments of various aspects of the invention are directed to formation of three-dimensional structures from materials some, or all, of which may be electrodeposited (as illustrated in FIGS. 1A-4I) or electroless deposited. Some of these structures may be formed from a single build level formed from one or more deposited materials while others are formed from a plurality of build layers each including at least two materials (e.g. two or more layers, more preferably five or more layers, and most preferably ten or more layers). In some embodiments, layer thicknesses may be as small as one micron or as large as fifty microns. In other embodiments, thinner layers may be used while in other embodiments, thicker layers may be used. In some embodiments, microscale structures have lateral features positioned with 0.1-10 micron level precision and minimum features size on the order of microns to tens of microns. In other embodiments structures with less precise feature placement and/or larger minimum features may be formed. In still other embodiments, higher precision and smaller minimum feature sizes may be desirable. In the present application meso-scale and millimeter-scale have the same meaning and refer to devices that may have one or more dimensions that may extend into the 0.5-50 millimeter range, or somewhat larger and features positioned with a precision in the micron to 100 micron range and with minimum feature sizes on the order of tens of microns to hundreds of microns.

The various embodiments, alternatives, and techniques disclosed herein may form multi-layer structures using a single patterning technique on all layers or using different patterning techniques on different layers. For example, various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), and/or adhered masks and masking operations (masks and operations that use masks that are adhered to a substrate onto which selective deposition or etching is to occur as opposed to only being contacted to it). Conformable contact masks, proximity masks, and non-conformable contact masks share the property that they are preformed and brought to, or in proximity to, a surface which is to be treated (i.e. the exposed portions of the surface are to be treated). These masks can generally be removed without damaging the mask or the surface that received treatment to which they were contacted or located in proximity to. Adhered masks are generally formed on the surface to be treated (i.e. the portion of that surface that is to be masked) and bonded to that surface such that they cannot be separated from that surface without being completely destroyed or damaged beyond any point of reuse. Adhered masks may be formed in a number of ways including (1) by application of a photoresist, selective exposure of the photoresist, and then development of the photoresist, (2) selective transfer of pre-patterned masking material, and/or (3) direct formation of masks from computer-controlled depositions of material.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e. regions that lie within the top and bottom boundary levels that define a different layer's geometric configuration). Such use of selective etching and interlaced material deposition in association with multiple layers is described in U.S. patent application Ser. No. 10/434,519, by Smalley, now U.S. Pat. No. 7,252,861, and entitled "Methods of and Apparatus for Electrochemically Fabricating Structures Via Interlaced Layers or Via Selective Etching and Filling of Voids" which is hereby incorporated herein by reference as if set forth in full.

Temporary substrates on which structures may be formed may be of the sacrificial-type (i.e. destroyed or damaged during separation of deposited materials to the extent they cannot be reused), non-sacrificial-type (i.e. not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g. replanarizing one or more selected surfaces or applying a release layer, and the like) though they may or may not be reused for a variety of reasons.

Definitions

This section of the specification is intended to set forth definitions for a number of specific terms that may be useful in describing the subject matter of the various embodiments of the invention. It is believed that the meanings of most if not all of these terms are clear from their general use in the specification but they are set forth hereinafter to remove any ambiguity that may exist. It is intended that these definitions be used in understanding the scope and limits of any claims that use these specific terms. As far as interpretation of the claims of this patent disclosure are concerned, it is intended that these definitions take presence over any contradictory definitions or allusions found in any materials which are incorporated herein by reference.

"Build" as used herein refers, as a verb, to the process of building a desired structure (or part) or plurality of structures (or parts) from a plurality of applied or deposited materials which are stacked and adhered upon application or deposition or, as a noun, to the physical structure (or part) or structures (or parts) formed from such a process. Depending on the context in which the term is used, such physical structures may include a desired structure embedded within a sacrificial material or may include only desired physical structures which may be separated from one another or may require dicing and/or slicing to cause separation.

"Build axis" or "build orientation" is the axis or orientation that is substantially perpendicular to substantially planar levels of deposited or applied materials that are used in building up a structure. The planar levels of deposited or applied materials may be or may not be completely planar but are substantially so in that the overall extent of their cross-sectional dimensions are significantly greater than the height of any individual deposit or application of material (e.g. 100, 500, 1000, 5000, or more times greater). The planar nature of the deposited or applied materials may come about from use of a process that leads to planar deposits or it may result from a planarization process (e.g. a process that includes mechanical abrasion, e.g. lapping, fly cutting, grinding, or the like) that is used to remove material regions of excess height. Unless explicitly noted otherwise, "vertical" as used herein refers to the build axis or nominal build axis (e.g. if the layers are not stacking with perfect registration) while "horizontal" or "lateral" refers to a direction that is parallel to the plane of the layers (i.e. the plane that is substantially perpendicular to the build axis). For convenience of terminology and without implying a particular physical build orientation, successive layers shall be considered to be added above previously formed layers and preceding layers will be considered to exist below later formed layers. For example, during electroplating actual build orientation may be up-facing vertical, horizontal, or at some other angle while during planarization actual build orientation may be horizontal, down-facing vertical, or at some other orientation but successive layers will still be considered to be formed on or above previously formed layers unless explicitly indicated otherwise.

"Build layer" or "layer of structure" as used herein does not refer to a deposit of a specific material but instead refers to a region of a build located between a lower boundary level and an upper boundary level which generally defines a single cross-section of a structure being formed or structures which are being formed in parallel. Depending on the details of the actual process used to form the structure, build layers are generally formed on and adhered to previously formed build layers. In some processes the boundaries between build layers are defined by planarization operations which result in successive build layers being formed on substantially planar upper surfaces of previously formed build layers. In some embodiments, the substantially planar upper surface of the preceding build layer may be textured to improve adhesion between the layers. In other build processes, openings may exist in or be formed in the upper surface of a previous but only partially formed build layer or build layers such that the openings in the previous build layer or build layers are filled with materials deposited in association with current build layer which will cause interlacing of build layers and material deposits. Such interlacing is described in the previously referenced '519 patent application. This referenced application is incorporated herein by reference as if set forth in full. In most embodiments, a build layer includes at least one primary structural material and at least one primary sacrificial material. However, in some embodiments, two or more primary structural materials may be used without a primary sacrificial material (e.g. when one primary structural material is a dielectric and the other is a conductive material). In some embodiments, build layers are distinguishable from each other by the source of the data that is used to yield patterns of the deposits, applications, and/or etchings of material that form the respective build layers. For example, data descriptive of a structure to be formed which is derived from data extracted from different vertical levels of a data representation of the structure define different build layers of the structure. The vertical separation of successive pairs of such descriptive data may define the thickness of build layers associated with the data. As used herein, at times, "build layer" may be loosely referred simply as "layer". In many embodiments, deposition thickness of primary structural or sacrificial materials (i.e. the thickness of any particular material after it is deposited) is generally greater than the layer thickness and a net deposit thickness is set via one or more planarization processes which may include, for example, mechanical abrasion (e.g. lapping, fly cutting, polishing, and the like) and/or chemical etching (e.g. using selective or non-selective etchants). The lower boundary and upper boundary for a build layer may be set and defined in different ways. From a design point of view, they may be set based on a desired vertical resolution of the structure (which may vary with height). From a data manipulation point of view, the vertical layer boundaries may be defined as the vertical levels at which data descriptive of the structure is processed or the layer thickness may be defined as the height separating successive levels of cross-sectional data that dictate how the structure will be formed. From a fabrication point of view, depending on the exact fabrication process used, the upper and lower layer boundaries may be defined in a variety of different ways. For example, by planarization levels or effective planarization levels (e.g. lapping levels, fly cutting levels, chemical mechanical polishing levels, mechanical polishing levels, vertical positions of structural and/or sacrificial materials after relatively uniform etch back following a mechanical or chemical mechanical planarization process). For example, by levels at which process steps or operations are repeated. At levels at which, at least theoretically, lateral extents of structural material can be changed to define new cross-sectional features of a structure.

"Layer thickness" is the height along the build axis between a lower boundary of a build layer and an upper boundary of that build layer.

"Planarization" is a process that tends to remove materials, above a desired plane, in a substantially non-selective manner such that all deposited materials are brought to a substantially common height or desired level (e.g. within 20%, 10%, 5%, or even 1% of a desired layer boundary level). For example, lapping removes material in a substantially non-selective manner though some amount of recession of one material versus another material may occur (e.g. copper may recess relative to nickel). Planarization may occur primarily via mechanical means, e.g. lapping, grinding, fly cutting, milling, sanding, abrasive polishing, frictionally induced melting, other machining operations, or the like (i.e. mechanical planarization). Mechanical planarization may be followed or preceded by thermally induced planarization (e.g. melting) or chemically induced planarization (e.g. etching). Planarization may occur primarily via a chemical and/or electrical means (e.g. chemical etching, electrochemical etching, or the like). Planarization may occur via a simultaneous combination of mechanical and chemical etching (e.g. chemical mechanical polishing (CMP)).

"Structural material" as used herein refers to a material that remains part of the structure when put into use.

"Supplemental structural material" as used herein refers to a material that forms part of the structure when the structure is put to use but is not added as part of the build layers but instead is added to a plurality of layers simultaneously (e.g. via one or more coating operations that applies the material, selectively or in a blanket fashion, to one or more surfaces of a desired build structure that has been released from a sacrificial material.

"Primary structural material" as used herein is a structural material that forms part of a given build layer and which is typically deposited or applied during the formation of that build layer and which makes up more than 20% of the structural material volume of the given build layer. In some embodiments, the primary structural material may be the same on each of a plurality of build layers or it may be different on different build layers. In some embodiments, a given primary structural material may be formed from two or more materials by the alloying or diffusion of the two or more materials to form a single material. The structural material on a given layer may be a single primary structural material or may be multiple primary structural materials and may further include one or more secondary structural materials.

"Secondary structural material" as used herein is a structural material that forms part of a given build layer and is typically deposited or applied during the formation of the given build layer but is not a primary structural material as it individually accounts for only a small volume of the structural material associated with the given layer. A secondary structural material will account for less than 20% of the volume of the structural material associated with the given layer. In some preferred embodiments, each secondary structural material may account for less than 10%, 5%, or even 2% of the volume of the structural material associated with the given layer. Examples of secondary structural materials may include seed layer materials, adhesion layer materials, barrier layer materials (e.g. diffusion barrier material), and the like. These secondary structural materials are typically applied to form coatings having thicknesses less than 2 microns, 1 micron, 0.5 microns, or even 0.2 microns. The coatings may be applied in a conformal or directional manner (e.g. via CVD, PVD, electroless deposition, or the like). Such coatings may be applied in a blanket manner or in a selective manner. Such coatings may be applied in a planar manner (e.g. over previously planarized layers of material) as taught in U.S. patent application Ser. No. 10/607,931, now U.S. Pat. No. 7,239,219. In other embodiments, such coatings may be applied in a non-planar manner, for example, in openings in and over a patterned masking material that has been applied to previously planarized layers of material as taught in U.S. patent application Ser.

No. 10/841,383, now U.S. Pat. No. 7,195,989. These referenced applications are incorporated herein by reference as if set forth in full herein.

"Functional structural material" as used herein is a structural material that would have been removed as a sacrificial material but for its actual or effective encapsulation by other structural materials. Effective encapsulation refers, for example, to the inability of an etchant to attack the functional structural material due to inaccessibility that results from a very small area of exposure and/or due to an elongated or tortuous exposure path. For example, large (10,000 $\mu m^2$) but thin (e.g. less than 0.5 microns) regions of sacrificial copper sandwiched between deposits of nickel may define regions of functional structural material depending on ability of a release etchant to remove the sandwiched copper.

"Stand alone structural material" or "genuine structural material" is a structural material that is resistive or not substantially removed by a sacrificial material etchant that is used in separating sacrificial and structural materials.

"Core structural material" is a structural material with no portion of the perimeter of the core structural material on a given layer being exposed to anything external to the structure, i.e. it is directly or indirectly surrounded by one or more other structural materials. In many embodiments, the core structural material is likewise completely bounded, or substantially bounded (such that an external chemical environment has little or no direct impact on the core material) by one or more structural materials located as part of the top or bottom of the given layer or located as part of one or more preceding or succeeding layers. If ambiguity exists in a given context completely isolated core structural material may be labeled "isolated core structural material" or fully enclosed or encapsulated core structural material.

"Exposed core structural material" is a core structural material that is not fully bounded on the sides by one or more other structural materials on a given layer such that it is exposed to a chemical environment that is external to the structure "Shell Structural material" is a term that may be used to label one or more other structural materials that surround or partially surround a core structural material on a given layer and/or bound, directly or indirectly, the core structural material from above or below.

"Sacrificial material" is material that forms part of a build layer but is not a structural material. Sacrificial material on a given build layer is separated from structural material on that build layer after formation of that build layer is completed and more generally is removed from a plurality of layers after completion of the formation of the plurality of layers during a "release" process that removes the bulk of the sacrificial material or materials. In general, sacrificial material is located on a build layer during the formation of one, two, or more subsequent build layers and is thereafter removed in a manner that does not lead to a planarized surface. Materials that are applied primarily for masking purposes, i.e. to allow subsequent selective deposition or etching of a material, e.g. photoresist that is used in forming a build layer but does not form part of the build layer) or that exist as part of a build for less than one or two complete build layer formation cycles are not considered sacrificial materials as the term is used herein but instead shall be referred as masking materials or as temporary materials. These separation processes are sometimes referred to as release processes and may or may not involve the separation of structural material from a build substrate. In many embodiments, sacrificial material within a given build layer is not removed until all build layers making up the three-dimensional structure have been formed. Of course, sacrificial material may be, and typically is, removed from above the upper level of a current build layer during planarization operations during the formation of the current build layer. Sacrificial material is typically removed via a chemical etching operation but in some embodiments may be removed via a melting operation or electrochemical etching operation. In typical structures, the removal of the sacrificial material (i.e. release of the structural material from the sacrificial material) does not result in planarized surfaces but instead results in surfaces that are dictated by the boundaries of structural materials located on each build layer. Sacrificial materials are typically distinct from structural materials by having different properties therefrom (e.g. chemical etchability, hardness, melting point, etc.) but in some cases, as noted previously, what would have been a sacrificial material may become a structural material by its actual or effective encapsulation by other structural materials. Similarly, structural materials may be used to form sacrificial structures that are separated from a desired structure during a release process via the sacrificial structures being only attached to sacrificial material or potentially by dissolution of the sacrificial structures themselves using a process that is insufficient to reach structural material that is intended to form part of a desired structure. It should be understood that in some embodiments, small amounts of structural material may be removed, after or during release of sacrificial material. Such small amounts of structural material may have been inadvertently formed due to imperfections in the fabrication process or may result from the proper application of the process but may result in features that are less than optimal (e.g. layers with stairs steps in regions where smooth sloped surfaces are desired. In such cases the volume of structural material removed is typically minuscule compared to the amount that is retained and thus such removal is ignored when labeling materials as sacrificial or structural. Sacrificial materials are typically removed by a dissolution process, or the like, that destroys the geometric configuration of the sacrificial material as it existed on the build layers. In many embodiments, the sacrificial material is a conductive material such as a metal. As will be discussed hereafter, masking materials though typically sacrificial in nature are not termed sacrificial materials herein unless they meet the required definition of sacrificial material.

"Supplemental sacrificial material" as used herein refers to a material that does not form part of the structure when the structure is put to use and is not added as part of the build layers but instead is added to a plurality of layers simultaneously (e.g. via one or more coating operations that applies the material, selectively or in a blanket fashion, to a one or more surfaces of a desired build structure that has been released from an initial sacrificial material. This supplemental sacrificial material will remain in place for a period of time and/or during the performance of certain post layer formation operations, e.g. to protect the structure that was released from a primary sacrificial material but will be removed prior to putting the structure to use.

"Primary sacrificial material" as used herein is a sacrificial material that is located on a given build layer and which is typically deposited or applied during the formation of that build layer and which makes up more than 20% of the sacrificial material volume of the given build layer. In some embodiments, the primary sacrificial material may be the same on each of a plurality of build layers or may be different on different build layers. In some embodiments, a given primary sacrificial material may be formed from two or more materials by the alloying or diffusion of the two or more materials to form a single material. The sacrificial material on a given layer may be a single primary sacrificial material or may be multiple primary sacrificial materials and may further include one or more secondary sacrificial materials.

"Secondary sacrificial material" as used herein is a sacrificial material that is located on a given build layer and is typically deposited or applied during the formation of the build layer but is not a primary sacrificial material as it individually accounts for only a small volume of the sacrificial material associated with the given layer. A secondary sacrificial material will account for less than 20% of the volume of the sacrificial material associated with the given layer. In some preferred embodiments, each secondary sacrificial material may account for less than 10%, 5%, or even 2% of the volume of the sacrificial material associated with the given layer. Examples of secondary structural materials may include seed layer materials, adhesion layer materials, barrier layer materials (e.g. diffusion barrier material), and the like. These secondary sacrificial materials are typically applied to form coatings having thicknesses less than 2 microns, 1 micron, 0.5 microns, or even 0.2 microns). The coatings may be applied in a conformal or directional manner (e.g. via CVD, PVD, electroless deposition, or the like). Such coatings may be applied in a blanket manner or in a selective manner. Such coatings may be applied in a planar manner (e.g. over previously planarized layers of material) as taught in the previously referenced '931 patent application. In other embodiments, such coatings may be applied in a non-planar manner, for example, in openings in and over a patterned masking material that has been applied to previously planarized layers of material as taught in the previously referenced '383 patent application. These referenced applications are incorporated herein by reference as if set forth in full herein.

"Adhesion layer", "seed layer", "barrier layer", and the like refer to coatings of material that are thin in comparison to the layer thickness and thus generally form secondary structural material portions or sacrificial material portions of some layers. Such coatings may be applied uniformly over a previously formed build layer, they may be applied over a portion of a previously formed build layer and over patterned structural or sacrificial material existing on a current (i.e. partially formed) build layer so that a non-planar seed layer results, or they may be selectively applied to only certain locations on a previously formed build layer. In the event such coatings are non-selectively applied, selected portions may be removed (1) prior to depositing either a sacrificial material or structural material as part of a current layer or (2) prior to beginning formation of the next layer or they may remain in place through the layer build up process and then etched away after formation of a plurality of build layers.

"Masking material" is a material that may be used as a tool in the process of forming a build layer but does not form part of that build layer. Masking material is typically a photopolymer or photoresist material or other material that may be readily patterned. Masking material is typically a dielectric. Masking material, though typically sacrificial in nature, is not a sacrificial material as the term is used herein. Masking material is typically applied to a surface during the formation of a build layer for the purpose of allowing selective deposition, etching, or other treatment and is removed either during the process of forming that build layer or immediately after the formation of that build layer.

"Multi-layer structures" are structures formed from multiple build layers of deposited or applied materials.

"Multi-layer three-dimensional (or 3D or 3-D) structures" are multi-layer structures that are formed from at least two layers where the structural material portion of at least two of the at least two layers at least partially overlap and are bonded together but where at least one of the layers has a portion that does not completely overlap structural material portions of the other. In other words, a Boolean intersection of the area covered by the two layers is non-zero and a Boolean subtraction of the area covered by at least one of the layers relative to the other layer is non-zero (i.e. an upper layer has a down-facing portion relative to the lower layer or the lower layer has an up-facing portion relative to the upper layer.

"Complex multi-layer three-dimensional (or 3D or 3-D) structures" are multi-layer three-dimensional structures formed from at least three layers where, when considering a single structure, a line may be defined that hypothetically extends vertically through at least some portion of the build layers of the structure and extends from structural material through sacrificial material and back through structural material or will extend from sacrificial material through structural material and back through sacrificial material (these might be termed vertically complex multi-layer three-dimensional structures). Alternatively, complex multi-layer three-dimensional structures may be defined as multi-layer three-dimensional structures formed from at least two layers where, when considering a single structure, a line may be defined that hypothetically extends horizontally through at least some portion of a build layer of the structure that will extend from structural material through sacrificial material and back through structural material (these might be termed horizontally complex multi-layer three-dimensional structures). Worded another way, in complex multi-layer three-dimensional structures, a vertically or horizontally extending hypothetical line will extend from one of structural material to void (when the sacrificial material is removed) and then back to structural material as the line is traversed along at least a portion of the line.

"Moderately complex multi-layer three-dimensional (or 3D or 3-D) structures are complex multi-layer 3D structures for which, when considering a single structure, the alternating of structure-void-structure not only exists along one of a vertically or horizontally extending line but along lines extending both vertically and horizontally.

"Highly complex multi-layer (or 3D or 3-D) structures are complex multi-layer 3D structures for which, when considering a single structure, the structure-to-void-to-structure or void-to-structure-to-void alternating occurs not only once but occurs a plurality of times along a definable horizontally and/or vertically extending line.

"Up-facing feature" is an element dictated by the cross-sectional data for a given build layer "n" and a next build layer "n+1" that is to be formed from a given material that exists on the build layer "n" but does not exist on the immediately succeeding build layer "n+1". For convenience the term "up-facing feature" will apply to such features regardless of the build orientation.

"Down-facing feature" is an element dictated by the cross-sectional data for a given build layer "n" and a preceding build layer "n−1" that is to be formed from a given material that exists on build layer "n" but does not exist on the immediately preceding build layer "n−1". As with up-facing features, the term "down-facing feature" shall apply to such features regardless of the actual build orientation.

"Continuing region" is the portion of a given build layer "n" that is dictated by the cross-sectional data for the given build layer "n", a next build layer "n+1" and a preceding build layer "n−1" that is neither up-facing nor down-facing for the build layer "n".

"Minimum feature size" or "MFS" refers to a necessary or desirable spacing between structural material elements on a given layer that are to remain distinct in the final device configuration. If the minimum feature size is not maintained for structural material elements on a given layer, the fabrication process may result in structural material inadvertently bridging what were intended to be two distinct elements (e.g. due to masking material failure or failure to appropriately fill voids with sacrificial material during formation of the given layer such that during formation of a subsequent layer structural material inadvertently fills the void). More care during fabrication can lead to a reduction in minimum feature size. Alternatively, a willingness to accept greater losses in productivity (i.e. lower yields) can result in a decrease in the minimum feature size. However, during fabrication for a given set of process parameters, inspection diligence, and yield (successful level of production) a minimum design feature size is set in one way or another. The above described minimum feature size may more appropriately be termed minimum feature size of gaps or voids (e.g. the MFS for sacrificial material regions when sacrificial material is deposited first). Conversely a minimum feature size for structure material regions (minimum width or length of structural material elements) may be specified. Depending on the fabrication method and order of deposition of structural material and sacrificial material, the two types of minimum feature sizes may be the same or different. In practice, for example, using electrochemical fabrication methods as described herein, the minimum features size on a given layer may be roughly set to a value that approximates the layer thickness used to form the layer and it may be considered the same for both structural and sacrificial material widths. In some more rigorously implemented processes (e.g. with higher examination regiments and tolerance for rework), it may be set to an amount that is 80%, 50%, or even 30% of the layer thickness. Other values or methods of setting minimum feature sizes may be used. Worded another way, depending on the geometry of a structure, or plurality of structures, being formed, the structure, or structures, may include elements (e.g. solid regions) which have dimensions smaller than a first minimum feature size and/or have spacings, voids, openings, or gaps (e.g. hollow or empty regions) located between elements, where the spacings are smaller than a second minimum feature size where the first and second minimum feature sizes may be the same or different and where the minimum feature sizes represent lower limits at which formation of elements and/or spacing can be reliably formed. Reliable formation refers to the ability to accurately form or produce a given geometry of an element, or of the spacing between elements, using a given formation process, with a minimum acceptable yield. The minimum acceptable yield may depend on a number of factors including: (1) number of features present per layer, (2) numbers of layers, (3) the criticality of the successful formation of each feature, (4) the number and severity of other factors effecting overall yield, and (5) the desired or required overall yield for the structures or devices themselves. In some circumstances, the minimum size may be determined by a yield requirement per feature which is as low as 70%, 60%, or even 50%. While in other circumstances the yield requirement per feature may be as high as 90%, 95%, 99%, or even higher. In some circumstances (e.g. in producing a filter element) the failure to produce a certain number of desired features (e.g. 20-40% failure may be acceptable while in an electrostatic actuator, the failure to produce a single small space between two moveable electrodes may result in failure of the entire device. The MFS, for example, may be defined as the minimum width of a narrow sacrificial element (e.g. photoresist element or sacrificial material element) or structural element (e.g. structural material element) that may be reliably formed (e.g. 90-99.9 times out of 100) which is either independent of any wider structures or has a substantial independent length (e.g. 200-1000 microns) before connecting to a wider region.

"Sub-layer" as used herein refers to a portion of a build layer that typically includes the full lateral extents of that build layer but only a portion of its height. A sub-layer is usually a vertical portion of build layer that undergoes independent processing compared to another sub-layer of that build layer. As used herein, use of a sub-layer in the formation of a layer requires use of at least a second sub-layer in formation of that layer and as such, the sublayers shall be numbered (e.g. first, second, etc., depending on their order of formation) and the layer of which they form a part may be referred to as a "compound layer" to avoid confusion with normal layer build up processes as set forth herein.

Probes with Cores and with Different Non-Core Structural Materials on Different Layers FIGS. 5A-5D help illustrate how the fabrication processes noted above, and elsewhere herein, can be applied in a batch manner to the formation of a plurality of multi-layer probe structures. FIG. 5A provides a side cut view of a plurality of example parts 531-A to 531-F formed from a single structural material 532 on each of three layers L1, L2 and L3. In addition to the structural material each of the three layers L1-L3 were also formed with a sacrificial material 533. Layer 1 (L1) of the parts is formed on a release layer 534-2 that was formed on a substrate material 534-1 wherein together 534-1 and 534-2 may be considered a complete substrate 534. FIG. 5B provides a top view of the formed parts 531-A to 531-F wherein lateral regions (or X and Y regions) of individual parts can be seen. The substrate 534 (more particularly 534-1) may be considered to be reusable for building other parts after reformation of a release layer 534-2 that may be removed or become damaged during the fabrication of a previous set of parts or during the release of those parts from the substrate.

FIGS. 5C and 5D provide perspective views of the batch fabricated parts of FIGS. 5A and 5B. In FIG. 5C the parts are shown in the same process state as that of FIGS. 5A and 5B (i.e. prior to release of the parts from the sacrificial material 530 and from the substrate 534-1). FIG. 5D shows the six three-layer parts 531-A to 531-F after release but still in the same relative positions.

FIGS. 6A-6E illustrate five different example three-layer probe configurations, with each figure providing top views of structural material for $1^{st}$ to $3^{rd}$ layers for a single probe example. FIG. 6A illustrates the first 601-A, second 602-A, and third 603-A layers formed using a single structural material 632 without special tip configurations and without a special tip material. FIG. 6B illustrates the first 601-B, second 602-B, and third 603-B layers formed with a single structural material 632 and with only the second layer 602-B formed with a special pointed tip configuration 652 while still using material 632 as the tip material. FIG. 6C illustrates first 601-C, second 602-C, and third 603-C layers formed from a single structural material 632 with only the second layer 602-B formed with a special tip configuration 652 but with all three layers formed with a notched tail end or notched proximal end configuration 662 that may aid with mounting or bonding to a base. FIG. 6D illustrates first 601-D, second 602-D, and third 603-D layers with the first and third layers formed using a single structural material 632 but with the second layer 602-D having not only a special tip configuration 652 but also with the tip being formed of a different structural material, or tip contact material, 623 that is different from the structural material used to form the body of the probe. FIG. 6E illustrates first 601-E, second 602-E, and third 603-E layers wherein the first and third layers are formed with a single structural material 632 and wherein a compliant portion of the second layer 602-E is formed with a different structural material 642 while the tip is formed having a special tip configuration 652 and a distinct contact tip material 623.

Alternatives include contact tips at each end; use of probes in guide plates (e.g. single guide plates, pairs of guide plates, or even more than two guide plates); probes formed from multiple beams separated by air gaps; probes formed from multiple beams separated by dielectric materials; probes surrounded at least in part by dielectric material (e.g., in locations extending through conductive guide plate regions when electrical isolation is desired); straight probes; probes that are straight as formed but which are loaded into guide plates so as to achieve a predetermined flexed configuration (e.g., to ensure selected bending upon contact/usage); tips formed on more than one layer; multiple tips formed on a single end of a single layer; and probes formed with multiple independent and electrically isolated paths with separate contact tips or with separate contact regions (e.g. tips for signal paths and grounding regions to connect shields to guide plates or other conductive elements).

Figure 7A:
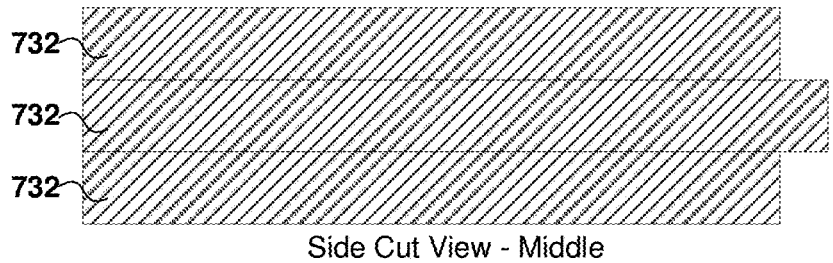
FIGS. 7A-7D illustrate four different similarly shaped example three-layer probe configurations with different materials forming some portions of some probes with each figure providing both a side-cut view and an end-cut view.
Figure 7A:
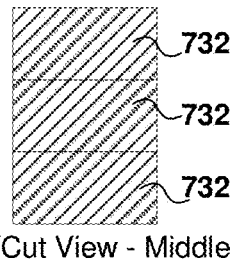
Figure 7B:
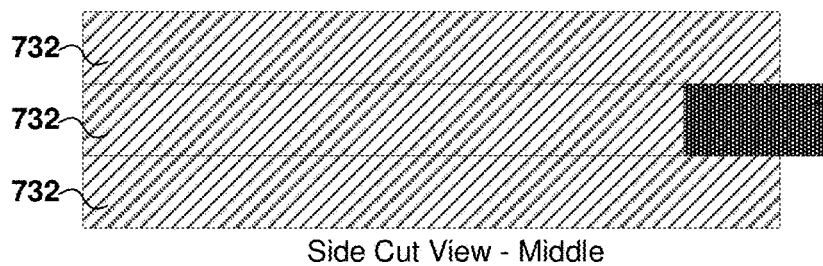
Figure 7B:
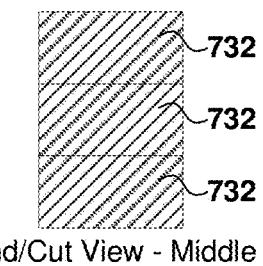
Figure 7C:
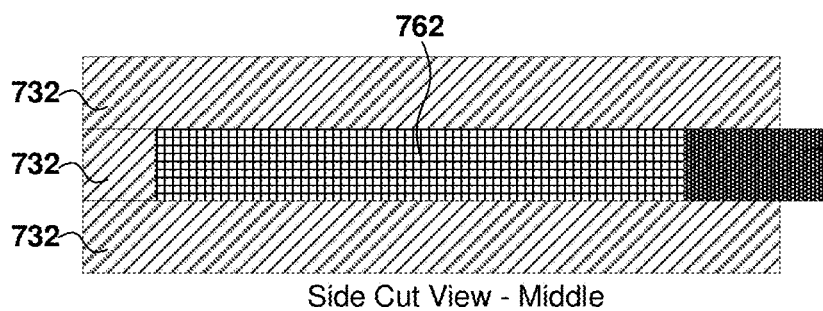
Figure 7C:
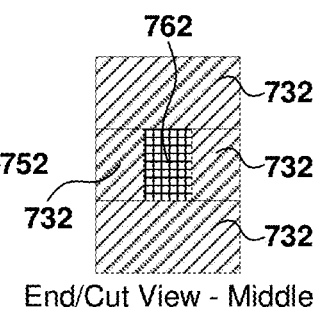
Figure 7D:
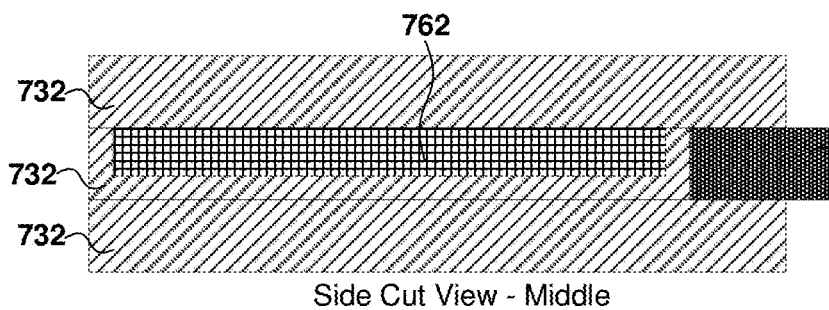
Figure 7D:
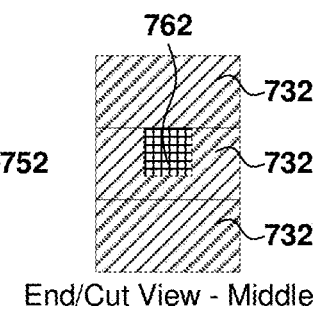

FIGS. 7A-7D illustrate four different similarly shaped example three-layer probe configurations with different materials forming some portions of some probes with each figure providing both a side-cut view and an end-cut view. FIG. 7A illustrates a side cut view and end cut view showing a probe with a single layer forming an extended tip but with all portions of all layers formed of the same material 732. FIG. 7B shows a probe having a distinct tip material 752 on one end. FIG. 7C shows a probe having a distinct tip material 752 on one end but also having a distinct core material 762 formed of a genuine structural material or of a functional structural material (e.g. copper) occupying at least part of a compliant intermediate portion of the length of the probe wherein the core material occupies the entire thickness of the second layer. FIG. 7D depicts a probe having a distinct tip material 752 and an intermediate core 762 formed within a shell material 732 using a core and shell technique that causes the shell material to occupy the base of the second layer as well as forming side walls around its core as will be discussed hereafter.

Figure 8A:
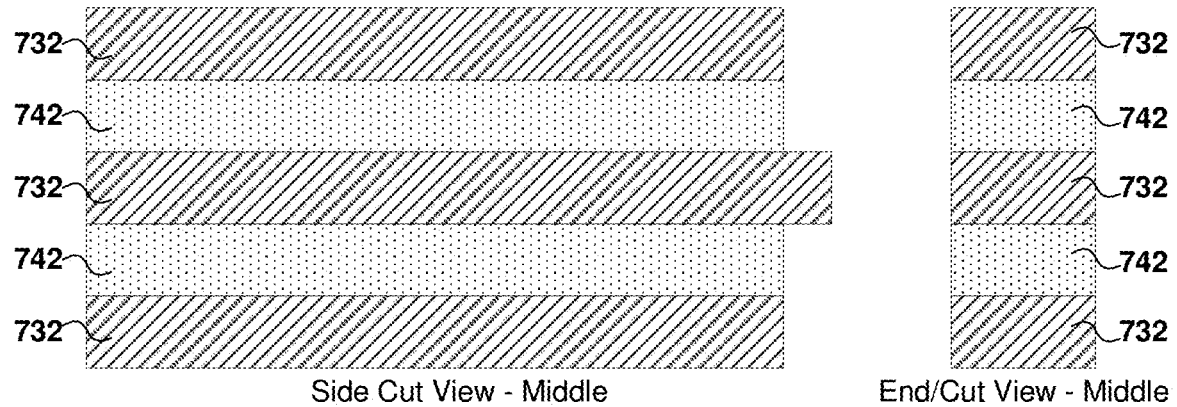
FIGS. 8A and 8B illustrate two different similarly shaped five-layer probe configurations with different materials forming some portions of each probe with each figure providing both a side-cut view and an end-cut view.
Figure 8B:
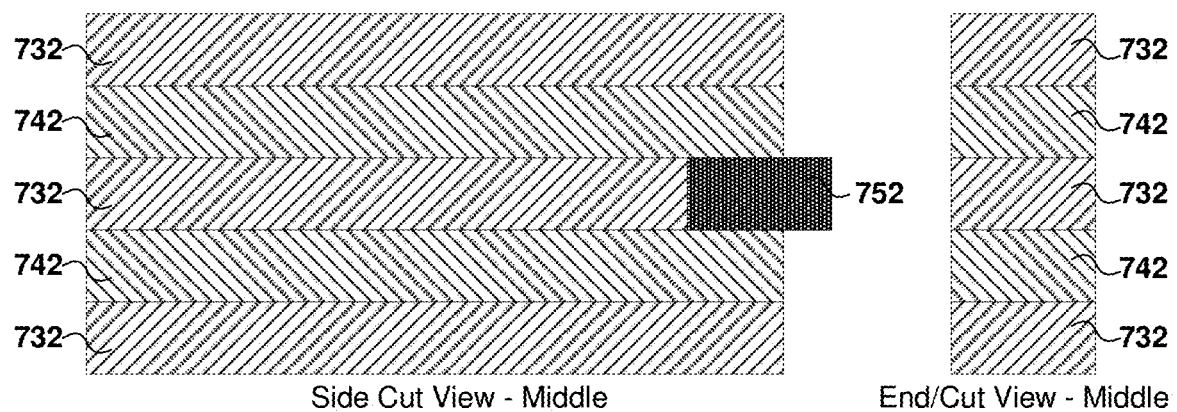
Figure 9A:
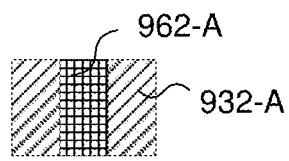
FIGS. 9A-9D provide illustrations of example core-shell configurations that can be formed on a single layer using different formation methods.
Figure 9B:
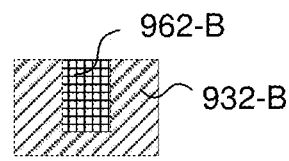
Figure 9C:
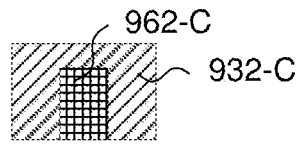
Figure 9D:

FIGS. 8A and 8B illustrate two different similarly shaped five-layer probe configurations with different materials forming some portions of each probe with each figure providing both a side-cut view and an end-cut view. FIG. 8A depicts the five-layer probe body as being formed from two different materials with the first, third, and fifth layers being formed from one genuine structural material 732 and the second and fourth layers being formed from a different genuine structural material 742. FIG. 8B depicts a probe similar to that of FIG. 8A with the exception of the right most tip end of the third layer replacing material 732 with a distinct tip material 752. Examples of genuine structural material 732 and 742 include Ni, NiCo, Pd, PdCo, Au, and Ag while examples of genuine structural material 752 include NiCo, Pd, and Rh for tip region.

FIGS. 9A-9D provide illustrations of example core-shell configurations that can be formed on a single layer using different formation methods. Such methods for making cores and shells may be used in forming selected portions of structures, forming portions of selected layers, or even in forming multiple shells and cores on selected layers, or cores and shells that extend into or through more than one layer. In some embodiments, shells and cores may be used when forming spring or compliant regions of probes, portions of compliant regions, and even tip regions of probes. In some embodiments, dielectric material may also be used to form dielectric shells around conductive probe regions, to form insulative regions between multiple independent conductive paths, and between inner and outer conductive coaxial portions of probes.

In a first approach (shown in FIG. 9A), masked based patterning may be used to form the core 962-A and shell 932-A such that the core extends from the bottom of a layer to the top of a layer. In this first approach, the layer may be formed with one or two patterning operations depending on whether the core material and the sacrificial material (SAC-MAT) are the same. The patterned deposition operations may be followed by one additional depositions which may be of the patterned or blanket type and which in turn are followed by one or more planarization operations to remove any overlying material and to set the height of the layer. Of course, depending on other layer features and materials that are being deposited, additional operations may be utilized in forming the layer.

In a second approach (shown in FIG. 9B), masked based thin shell deposition may be used to form the core 962-B and shell 932-B such that the shell of a given layer surrounds the sides and bottom of the core but does not provide for the capping of the top of the core. In this second approach, the shell may be formed within an opening in a surrounding conductive material (e.g. a SACMAT) wherein a deposition of shell material is made to a thickness that is less than the layer thickness. Since the shell material is deposited into a conductive pocket, the shell material forms an up-facing pocket with a bottom surface and side walls. After formation of the shell material, the core material may be deposited to fill the pocket to a desired depth (e.g. to a height that extends beyond the upper surface of the layer that is being formed). After completion of any other required deposition operations, planarization may be used to set the boundary level for the layer and to remove any overlying extraneous material.

In a third approach (shown in FIG. 9C), masked based thin core deposition followed by shell deposition may be used to form the core 962-C and shell 932-C such that the shell of a given layer surrounds the sides and the top of the core but does not underlie the core. In this third approach, the core may be patterned first by depositing the core within an opening in a mold (e.g. a photoresist mold) to a height less than that of the intended layer thickness. After formation of the core, the removal of any mold, and the formation of any needed additional mold, the shell material may be deposited to a depth that ensures the shell extends above the intended height of the layer. After any additional depositions or related formation operations, planarization may occur to the set the height of the layer leaving a shell that caps and surrounds the sides of a core.

In a fourth approach, sublayer formation may be used to form a core 962-D that overlays a shell 932-D as well as is capped by, and surrounded by, the shell. In such an approach, the single layer may be formed as two sublayers via the lower portion of the layer, i.e. first sublayer, being formed by the second approach which would end with a mid-level planarization and which in turn would be followed by formation of a cap which may or may not be part of a fully planarized second sublayer. Alternatively, a patterned deposition of the lower portion of the shell may be created by a deposition which has a height less than that of the layer thickness (e.g. to form a first sublayer portion), which may or may not be followed by planarization, and which is followed by the third approach to create the second sublayer portion.

The first through third approaches set forth above may be combined on successive layers to form cores and shells that extend completely, or in part, through multiple layers. For example, a core starting in the middle of an (N)th layer could extend through an (N+1)th layer and end in the middle of an (N+2)th layer by using the second method in forming the (N)th layer, the first method in forming the (N+1)th layer, and using the third method in forming the (N+2)th layer. Similarly a core extending from the bottom of an (N)th layer to the top of an (N+1)th layer could be made by using a standard process to form an (N−1)th layer and an (N+2)th layer while using the first method to form the (N)th and the (N+1) the layer. Other combinations are possible and will be understood by those of skill in the art after review of the teachings herein.

FIGS. 10A-17D provide similarly formatted cut end view examples of probes (looking along the longitudinal or axial axis of the probe) where a central portion of the probe can be seen with layer levels seen as horizontally extending structures with each layer formed from one or more materials that exist at a common height along the Z-axis and where the width of the probes can be seen as extending along the X-axis and with enhanced core structures where the "A" figures provide a base line example without the core feature to be illustrated while the "B", "C" and "D" figures provide different examples around a common theme and wherein dotted fill patterns are used to show the enhanced core features.

Figure 10A:
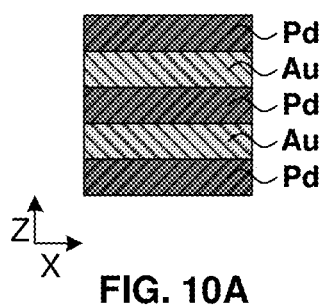
FIGS. 10A-17D provide similarly formatted cut end view examples of probes (looking along the longitudinal or axial axis of the probe along the sides of the layers from which the probes are formed) with enhanced core structures where the "A" figures provide a base line example without the core feature to be illustrated while the "B", "C" and "D" figures provide different examples around a common theme and wherein dotted fill patterns are used to show the enhanced core features.
Figure 10B:
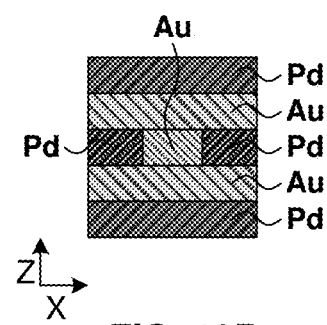
Figure 10C:
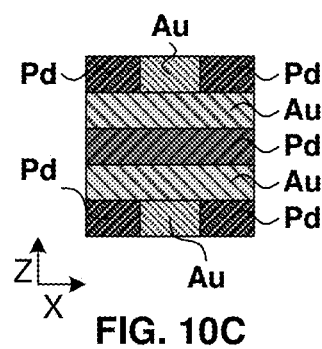
Figure 10D:
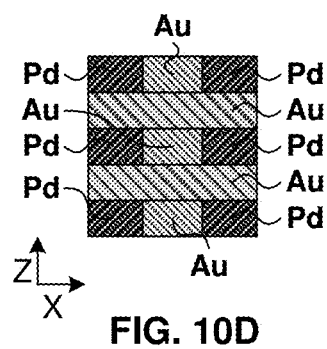
Figure 11A:
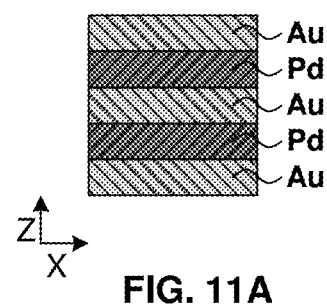
Figure 11B:
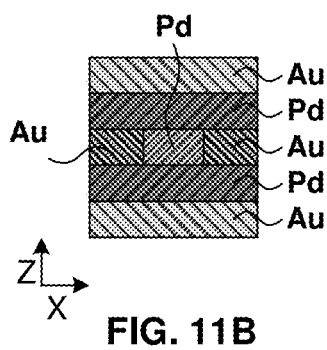
Figure 11C:
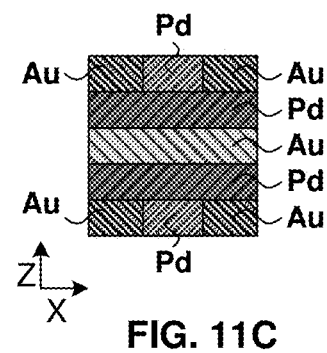
Figure 11D:
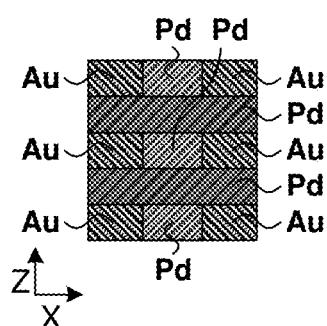

FIGS. 10A-10D each provide an end cut view through the middle of a probe formed with having non-core/non-shell layers and possibly having one or more core/shell layers (looking along a longitudinal axis of the probes, wherein a distal end and tip end features and a base end or proximal end features are not shown). FIG. 10A depicts a probed formed with alternating layers of palladium (Pd) and gold (Au) where the layers do not have shells that surround cores and thus may be considered non-shell/non-core layers. FIGS. 10B-10D show probes that include different variations of non-core/non-shell layers formed of gold (Au) and palladium (Pd) along with other layers formed with shells of palladium (Pd) and cores of gold (Au). FIG. 10B includes a gold core and palladium shell on one layer along with two non-core/non-shell layers of gold and two non-core/non-shell layers of palladium. FIG. 10O includes a gold core and palladium shell on two layers along with two non-core/non-shell layers of gold and one non-core/non-shell layer of palladium. FIG. 10D includes a gold core and palladium shell on three layers along with two intervening non-core/non-shell layers of gold. of the palladium layers. These embodiments provide a core on one or more selected layers where the core material is different from the shell material on those layers and where structural material on layers adjacent to the core layers does not shell material or basic structural material on adjacent layers is different even though the basic (or only) structural material of one layer is the same as core material of an adjacent layer. In the example of FIGS. 10B-10D the gold layers (i.e. the layers with only gold as the structural material do not have cores while one of more of the palladium layers (i.e. the layers with palladium also have no core or have gold cores (i.e. palladium acts as the only structural material or the structural material in a shell or core surrounding capacity).

FIGS. 11A-11D show a similar set of drawings to those of FIGS. 10A-10D but where the order of palladium and gold layers is reversed such that gold acts sometimes acts as a core material and other times as the only structural material on a layer while palladium acts a either the only structural material on some layers or as a shell material on one or more layers.

Figure 12A:
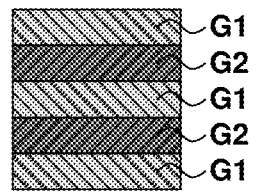
Figure 12B:
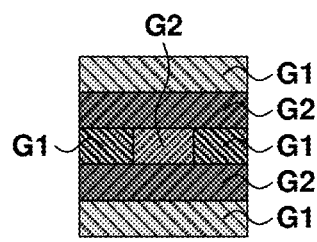
Figure 12C:
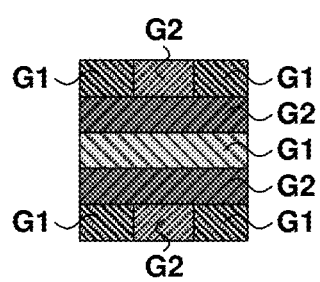
Figure 12D:
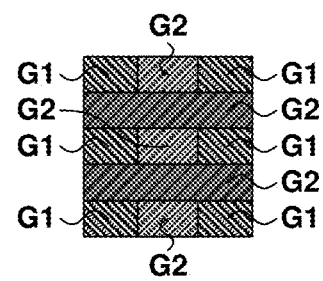

FIGS. 12A-12D follow the same format as FIGS. 10A-10D and 11A-11D but under a generalization where the probe has a body portion of 1st and 2nd alternating stacked materials G1 and G2 and a strip of one of the 1st or 2nd materials is added into one or more layers of the other of the 2nd or 1st materials. In FIGS. 12B-12D, G2 acts as either the only structural material on a given layer or as a core material on a given layer (for a given structure) while G1 acts as the shell material on a given layer or as the only structural material on the given layer (for a given structure). In these examples, shell material or primary structural material on adjacent layers is different while core material is similar to the primary structural material on adjacent layers though this is not necessarily always the case as will be seen in subsequent examples (e.g. the core material may be different than the shell materials or sole structural materials on both adjacent layers, it may be different from that of only one of the given layers, or common core materials or different core material may exist on more than one adjacent layer).

Figure 13A:
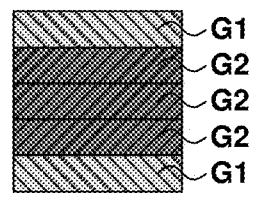
Figure 13B:
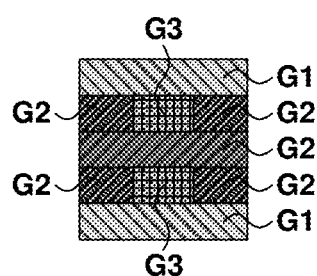
Figure 13C:
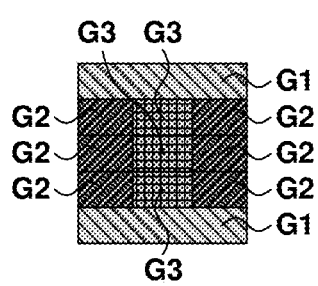
Figure 13D:
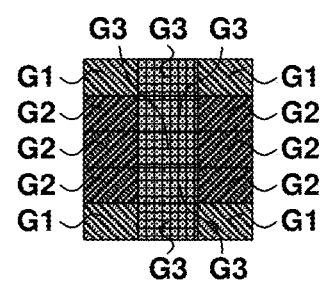

FIGS. 13A-13D again follows the same format as FIGS. 10A-10D and 11A-11D but under a generalization where the probe has a layered body portion with each layer formed from a selected shell material, which is a different material on at least two layers and where a strip of one of the materials is added, or a strip or core of a different material is added, into a central region of the shell material. FIG. 13B illustrates a five layer part with top and bottom layers of material G1, second and fourth layers of a shell material G2 and core material G3, and a third layer of only G2. In the embodiment of FIG. 13B different layers of structural material exist (either of the sole type or of the shell type, but they are the same between some adjacent layers (layers 2-3-4) and different between other adjacent layers (layers 1-2 and 4-5). FIG. 13C provides a G3 core within G2 shells on the second-fourth layers while layers 1 and 5 are solely G1 layers. Like FIG. 13B, FIG. 13C illustrates that some adjacent layers have common sole structural materials or shell materials while other adjacent layers have different sole structural materials or shell structural materials. FIG. 13D illustrates an embodiment where all layers may have cores and shells (layers 1-5) and that the core material may be the same from layer to layer (layers 1-5) while the shell material may be different between some adjacent layers (layers 1-2 and layers 4-5) and the same between other adjacent layers (layers 2-4).

In some variations, the strip (or core) of added material may have a high electrical conductivity compared to that of the surrounding material (e.g. by copper) as opposed to shell material that may be, for example Ni, NiCO, or Pd.

Figure 14A:
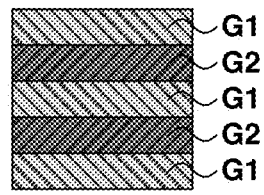
Figure 14B:
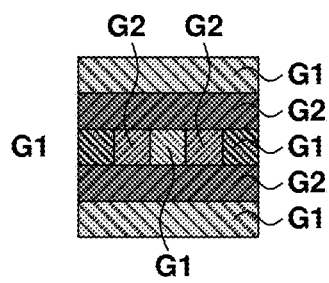
Figure 14C:
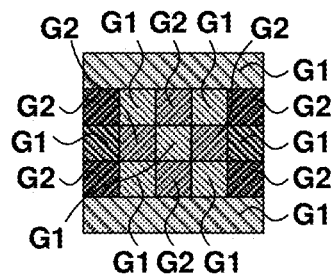
Figure 14D:
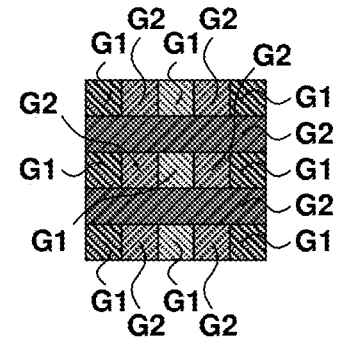

In some other variations, multiple strips (or cores) may be used on a single layer and/or on multiple layers as can be seen in the variations provided in FIGS. 14B-14D as compared to the un-cored example of FIG. 14A. FIG. 14B illustrates a part formed with 5 example layers with a single middle layer (third layer) formed with two cores of G2 encapsulated and spaced by material G1. In some configurations, material G1 in the middle of the layer may also be a core material but would imply that it is not directly joined with the exterior regions of material G1 on the that layer. As can be seen in the example of FIG. 14B, the sole structural material or shell material alternates from between successive layers G1-G2-G1-G2-G1. In FIGS. 14C and 14D, multiple cores are provided on multiple layers. In FIG. 14C, G1 provides two cores on each of layers 2 and layer 4 while G2 provides two cores on layer 3. In FIG. 14D, material G2 provides two cores on each of layers 1, 3 and 5 with shells of material G1 while material G2 is the sole structural material on layers 2 and 4. In some embodiments (FIG. 14C), both cores and shell materials may alternative between adjacent layers and even between multiple sets of consecutive adjacent layers or spaced adjacent layers.

Figure 15A:
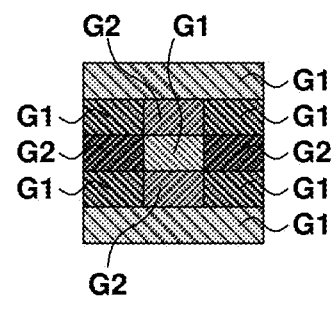
Figure 15B:
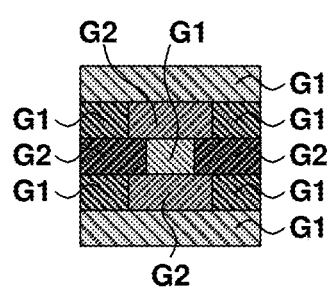
Figure 15C:
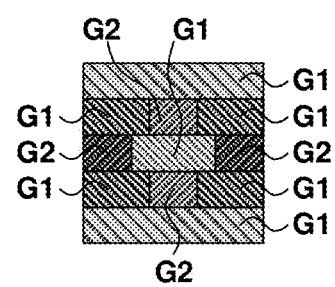
Figure 15D:
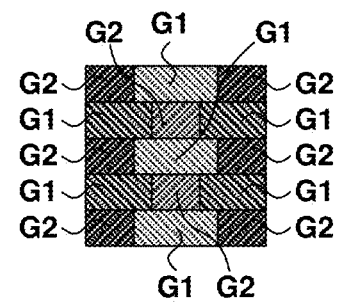

In still other variations, the cored region, or the non-cored region, may be resized to provide a desired overlap of common, or desired material, from layer-to-layer. FIGS. 15A-15D follow a pattern similar to that noted above where FIG. 15A shows a pattern of cores and shells without overlap while FIGS. 15B-15D provide examples with different extents or types of overlap between layers. In these examples, each layer of a set of consecutive layers is formed from strips (or cores) of at least two materials wherein the strips are configured such that one of the materials partially overlays and contacts common material of a preceding and/or succeeding layer. Embodiments with overlapped common material regions may provide enhanced structural integrated particularly when certain material combinations may provide reduced bonding compatibility due to material differences.

Figure 16A:
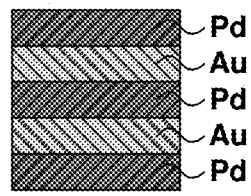
Figure 16B:
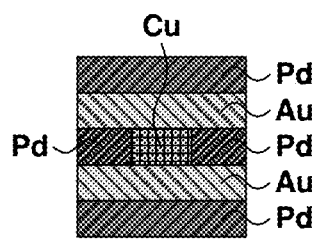
Figure 16D:
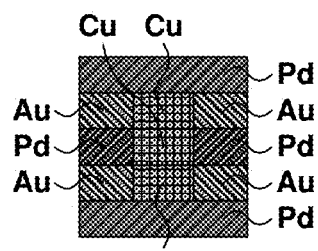
Figure 16C:
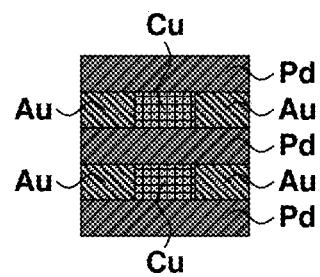

FIGS. 16A-16D provide illustrations of three example five-layer probes formed from alternating layers of gold and palladium where one or more copper cores are added to one or more of the interior gold and/or palladium layers with FIG. 16A providing a baseline. FIG. 16B provides alternating layers of palladium and gold (as sole or shell materials) with a copper core located in the middle palladium layer. FIG. 16C provides copper cores on gold layers 2 and 4 while FIG. 16D provide copper cores and two gold layers (layers 2 and 4) and one palladium layer (layer 3).

Figure 17A:
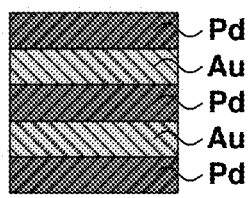
Figure 17B:
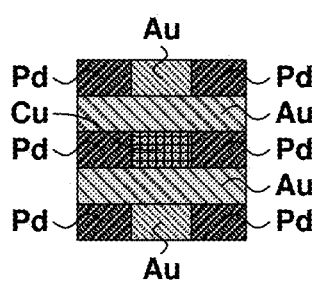
Figure 17D:
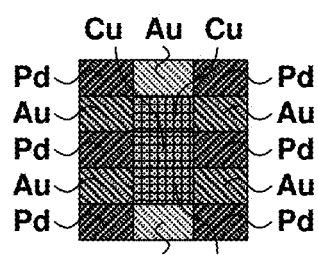
Figure 17C:
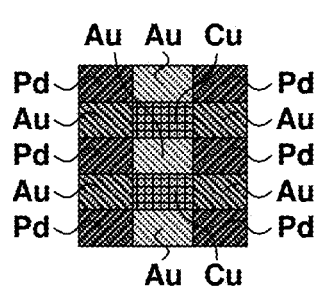

FIGS. 17A-17D provide illustrations of three different examples of a five-layer probe that includes one or more copper and/or gold cores where copper is assumed to be functional structural material and is only used when it can be fully encapsulated wherein FIG. 17A provides a baseline. FIGS. 17B-17D provide alternating layers of palladium and gold (as sole structural materials or as shell material with copper as a core material on selected palladium layers or gold layers and with gold as core material on selected palladium layers.

The examples herein provide improved structures by allowing for mixed or alternative sole or shell material between selected layers and inclusion of cores on selected layers and in some embodiments by allowing cores to be formed in multiples on given layers or on different layers and to allow overlaps in common material in multicore embodiments.

Numerous variations of the embodiments illustrated in the drawing are possible and will be understood by those of the skill in the art. For example, it will be understood that probes or other structures may be formed with different numbers of layers than shown herein (e.g. two layers, four layers, more than 5 layers). It will be understood that more than two cores may be provided on some layers, that cores may be segmented not only in directions perpendicular to axial or longitudinal direction of a probe or other structure but also in the longitudinal direction as well, different material may be used for cores and shell, shells and cores may be formed in a number of different ways. Structures, shells, and cores may be formed with different configurations on different layers; other materials may be added to selected regions of probes or other structures, e.g. bonding material, adhesion material, conductive tip material, dielectric materials, air gaps, semiconductor materials, ceramics, plastics, carbon fibers, and the like. Probes or other structures may be formed with single conductive paths, multiple conductive paths, coaxial configurations, grounded configurations, and the like. Conformal coating may be formed over structures after layer by layer buildup of the structures.

FURTHER COMMENTS AND CONCLUSIONS

Various other embodiments of the present invention exist. Some of these embodiments may be based on a combination of the teachings herein with various teachings incorporated herein by reference. For example, some embodiments may not use any blanket deposition process. Some embodiments may use selective deposition processes or blanket deposition processes on some layers that are not electrodeposition processes. Some embodiments may use nickel as a structural material while other embodiments may use different materials. For example, preferred spring materials include nickel (Ni), copper (Cu), beryllium copper (BeCu), nickel phosphorous (Ni—P), tungsten (W), aluminum copper (Al—Cu), steel, P7 alloy, palladium, molybdenum, manganese, brass, chrome, chromium copper (Cr—Cu), and combinations of these. Some embodiments may use copper as the structural material with or without a sacrificial material.

Some embodiments may apply the fabrication processes disclosed herein to the production of microprobes while other embodiments may apply these methods in the fabrication of other devices for other applications.

Structural or sacrificial dielectric materials may be incorporated into embodiments of the present invention in a variety of different ways. Such materials may form a third material, or higher material, deposited on selected layers or may form one of the first two materials deposited on some layers. Additional teachings concerning the formation of structures on dielectric substrates and/or the formation of structures that incorporate dielectric materials into the formation process and possibility into the final structures as formed are set forth in a number of patent applications filed Dec. 31, 2003. The first of these filings is U.S. Patent Application No. 60/534,184 which is entitled "Electrochemical Fabrication Methods Incorporating Dielectric Materials and/or Using Dielectric Substrates". The second of these filings is U.S. Patent Application No. 60/533,932, which is entitled "Electrochemical Fabrication Methods Using Dielectric Substrates". The third of these filings is U.S. Patent Application No. 60/534,157, which is entitled "Electrochemical Fabrication Methods Incorporating Dielectric Materials". The fourth of these filings is U.S. Patent Application No. 60/533,891, which is entitled "Methods for Electrochemically Fabricating Structures Incorporating Dielectric Sheets and/or Seed layers That Are Partially Removed Via Planarization". A fifth such filing is U.S. Patent Application No. 60/533,895, which is entitled "Electrochemical Fabrication Method for Producing Multi-layer Three-Dimensional Structures on a Porous Dielectric". Additional patent filings that provide teachings concerning incorporation of dielectrics into the EFAB process include U.S. patent application Ser. No. 11/139,262, filed May 26, 2005, now U.S. Pat. No. 7,501,328, by Lockard, et al., and which is entitled "Methods for Electrochemically Fabricating Structures Using Adhered Masks, Incorporating Dielectric Sheets, and/or Seed Layers that are Partially Removed Via Planarization". These patent filings are each hereby incorporated herein by reference as if set forth in full herein.

Some embodiments may employ diffusion bonding or the like to enhance adhesion between successive layers of material. Various teachings concerning the use of diffusion bonding in electrochemical fabrication processes are set forth in U.S. patent application Ser. No. 10/841,384 which was filed May 7, 2004 by Cohen et al., now abandoned, which is entitled "Method of Electrochemically Fabricating Multi-layer Structures Having Improved Interlayer Adhesion" and which is hereby incorporated herein by reference as if set forth in full. This application is hereby incorporated herein by reference as if set forth in full.

Further teaching about microprobes and electrochemical fabrication techniques are set forth in a number of prior US Patent Applications. These Filings include: (1) U.S. patent application Ser. No. 10/949,738, filed Sep. 24, 2004, by Kruglick et al., now abandoned, and which is entitled "Electrochemically Fabricated Microprobes"; (2) U.S. patent application Ser. No. 11/028,945, filed Jan. 3, 2005, by Cohen et al., now U.S. Pat. No. 7,640,651, and which is entitled "A Fabrication Method for Co-Fabricating a Probe Array and a Space Transformers". (3) U.S. patent application Ser. No. 11/029,180, filed Jan. 3, 2005, by Chen et al., now abandoned, and entitled "Pin-Type Probes for Contacting Electronic Circuits and Methods for Making Such Probes"; (4) U.S. patent application Ser. No. 11/325,404, filed Jan. 3, 2005, by Chen et al., now abandoned, and entitled "Vertical Microprobes for Contacting Electronic Components and Method for Making Such Probes"; (5) U.S. patent application Ser. No. 11/029,217, filed Jan. 3, 2005, by Kim et al., now U.S. Pat. No. 7,412,767, and entitled "Microprobe Tips and Methods For Making; and (6) U.S. patent application Ser. No. 11/173,241, filed Jun. 30, 2005, by Kumar et al., now abandoned, and entitled "Probe Arrays and Methods for Making". These patent filings are each hereby incorporated herein by reference as if set forth in full herein.

Additional teachings concerning the formation of structures on dielectric substrates and/or the formation of structures that incorporate dielectric materials into the formation process and possibility into the final structures as formed are set forth in a number of patent applications: (1) U.S. patent application Ser. No. 11/028,957, by Cohen, which was filed on Jan. 3, 2005, now abandoned, and which is entitled "Incorporating Dielectric Materials and/or Using Dielectric Substrates"; (2) U.S. patent application Ser. No. 10/841,300, by Lockard et al., which was filed on May 7, 2004, now abandoned, and which is entitled "Methods for Electrochemically Fabricating Structures Using Adhered Masks, Incorporating Dielectric Sheets, and/or Seed Layers that are Partially Removed Via Planarization"; (3) U.S. patent application Ser. No. 10/841,378, by Lembrikov et al., which was filed on May 7, 2004, now U.S. Pat. No. 7,527,721, and which is entitled "Electrochemical Fabrication Method for Producing Multi-layer Three-Dimensional Structures on a Porous Dielectric"; (4) U.S. patent application Ser. No. 11/029,216, filed Jan. 3, 2005 by Cohen et al., now abandoned, and entitled "Electrochemical Fabrication Methods Incorporating Dielectric Materials and/or Using Dielectric Substrates"; and (5) U.S. patent application Ser. No. 11/325, 405, filed Jan. 3, 2006 by Dennis R. Smalley, now abandoned, and entitled "Method of Forming Electrically Isolated Structures Using Thin Dielectric Coatings". These patent filings are each hereby incorporated herein by reference as if set forth in full herein.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, and the like.

| U.S. patent application Ser. No., Filing Date US App Pub No., Pub Date U.S. Pat. No., Pub Date | Inventor, Title |
|---|---|
| 09/493,496 - Jan. 28, 2000<br>—<br>6,790,377 - Sep. 14, 2004 | Cohen, "Method For Electrochemical Fabrication" |
| 10/677,556 - Oct. 1, 2003<br>2004-0134772 - Jul. 15, 2004 | Cohen, "Monolithic Structures Including Alignment and/or Retention Fixtures for Accepting Components" |
| 10/830,262 - Apr. 21, 2004<br>2004-0251142A - Dec. 16, 2004<br>7,198,704 - Apr. 3, 2007 | Cohen, "Methods of Reducing Interlayer Discontinuities in Electrochemically Fabricated Three-Dimensional Structures" |
| 10/271,574 - Oct. 15, 2002<br>2003-0127336A - Jul. 10, 2003<br>7,288,178 - Oct. 30, 2007 | Cohen, "Methods of and Apparatus for Making High Aspect Ratio Microelectromechanical Structures" |
| 10/697,597 - Dec. 20, 2002<br>2004-0146650A - Jul. 29, 2004 | Lockard, "EFAB Methods and Apparatus Including Spray Metal or Powder Coating Processes" |
| 10/677,498 - Oct. 1, 2003<br>2004-0134788 - Jul. 15, 2004<br>7,235,166 - Jun. 26, 2007 | Cohen, "Multi-cell Masks and Methods and Apparatus for Using Such Masks To Form Three-Dimensional Structures" |
| 10/724,513 - Nov. 26, 2003<br>2004-0147124 - Jul. 29, 2004<br>7,368,044 - May 6, 2008 | Cohen, "Non-Conformable Masks and Methods and Apparatus for Forming Three-Dimensional Structures" |
| 10/841,100 - May 7, 2004<br>2005-0032362 - Feb. 10, 2005<br>7,109,118 - Sep. 19, 2006 | Cohen, "Electrochemical Fabrication Methods Including Use of Surface Treatments to Reduce Overplating and/or Planarization During Formation of Multi-layer Three-Dimensional Structures" |

-continued

| U.S. patent application Ser. No., Filing Date US App Pub No., Pub Date U.S. Pat. No., Pub Date | Inventor, Title |
|---|---|
| 10/387,958 - Mar. 13, 2003 2003-022168A - Dec. 4, 2003 — | Cohen, "Electrochemical Fabrication Method and Application for Producing Three-Dimensional Structures Having Improved Surface Finish" |
| 10/434,494 - May 7, 2003 2004-0000489A - Jan. 1, 2004 — | Zhang, "Methods and Apparatus for Monitoring Deposition Quality During Conformable Contact Mask Plating Operations" |
| 10/434,289 - May 7, 2003 2004-0065555A - Apr. 8, 2004 — | Zhang, "Conformable Contact Masking Methods and Apparatus Utilizing In Situ Cathodic Activation of a Substrate" |
| 10/434,294 - May 7, 2003 2004-0065550A - Apr. 8, 2004 — | Zhang, "Electrochemical Fabrication Methods With Enhanced Post Deposition Processing" |
| 10/434,295 - May 7, 2003 2004-0004001A - Jan. 8, 2004 — | Cohen, "Method of and Apparatus for Forming Three-Dimensional Structures Integral With Semiconductor Based Circuitry" |
| 10/434,315 - May 7, 2003 2003-0234179A - Dec. 25, 2003 7,229,542 - Jun. 12, 2007 | Bang, "Methods of and Apparatus for Molding Structures Using Sacrificial Metal Patterns" |
| 10/434,103 - May 7, 2004 2004-0020782A - Feb. 5, 2004 7,160,429 - Jan. 9, 2007 | Cohen, "Electrochemically Fabricated Hermetically Sealed Microstructures and Methods of and Apparatus for Producing Such Structures" |
| 10/841,006 - May 7, 2004 2005-0067292 - May 31, 2005 — | Thompson, "Electrochemically Fabricated Structures Having Dielectric or Active Bases and Methods of and Apparatus for Producing Such Structures" |
| 10/724,515 - Nov. 26, 2003 2004-0182716 - Sep. 23, 2004 7,291,254 - Nov. 6, 2007 | Cohen, "Method for Electrochemically Forming Structures Including Non-Parallel Mating of Contact Masks and Substrates" |
| 10/841,347 - May 7, 2004 2005-0072681 - Apr. 7, 2005 — | Cohen, "Multi-step Release Method for Electrochemically Fabricated Structures" |
| 60/533,947 - Dec. 31, 2003 — — | Kumar, "Probe Arrays and Method for Making" |
| 60/534,183 - Dec. 31, 2003 — — | Cohen, "Method and Apparatus for Maintaining Parallelism of Layers and/or Achieving Desired Thicknesses of Layers During the Electrochemical Fabrication of Structures" |
| 11/733,195 - Apr. 9, 2007 2008-0050524 - Feb. 28, 2008 — | Kumar, "Methods of Forming Three-Dimensional Structures Having Reduced Stress and/or Curvature" |
| 11/506,586 - Aug. 8, 2006 2007-0039828 - Feb. 22, 2007 7,611,616 - Nov. 3, 2009 | Cohen, "Mesoscale and Microscale Device Fabrication Methods Using Split Structures and Alignment Elements" |
| 10/949,744 - Sep. 24, 2004 2005-0126916 - Jun. 16, 2005 7,498,714 - Mar. 3, 2009 | Lockard, "Three-Dimensional Structures Having Feature Sizes Smaller Than a Minimum Feature Size and Methods for Fabricating" |
| 14/676,716 - Apr. 1, 2015 2015-0308006 - Oct. 29, 2015 — | Cohen, "Methods and Apparatus for Forming Multi-Layer Structures Including Use of A Sacrificial Patternable Mold Material" |
| 62/736,998 - Sep. 26, 2018 — — | Smalley, "Probes Having Improved Mechanical and/or Electrical Properties for Making Contact between Electronic Circuit Elements and Methods for Making" |
| 16/584,818 - Sep. 26, 2019 — — | Smalley, "Probes Having Improved Mechanical and/or Electrical Properties for Making Contact between Electronic Circuit Elements and Methods for Making" |
| 16/791,288 - Feb. 14, 2020 — — | Frodis, "Multi-Beam Vertical Probes with Independent Arms Formed of a High Conductivity Metal for Enhancing Current Carrying Capacity and Methods for Making Such Probes" |
| 17/139,933 - Dec. 31, 2020 — — | Wu, "Compliant Pin Probes with Multiple Spring Segments and Compression Spring Deflection Stabilization Structures, Methods for Making, and Methods for Using" |
| 17/139,936 - Dec. 31, 2020 — — | Wu, "Probes with Multiple Springs, Methods for Making, and Methods for Using" |
| 17/240,962 - Apr. 26, 2021 — — | Lockard, "Buckling Beam Probe Arrays and Methods for Making Such Arrays Including Forming Probes with Lateral Positions Matching Guide Plate Hole Positions" |
| 17/320,173 - May 13, 2021 — — | Lockard, "Vertical Probe Arrays and Improved Methods for Making Using Temporary or Permanent Alignment Structures for Setting or Maintaining Probe-to-Probe Relationships" |

| U.S. patent application Ser. No., Filing Date US App Pub No., Pub Date U.S. Pat. No., Pub Date | Inventor, Title |
| --- | --- |
| 17/401,252 - Aug. 12, 2021 — — | Lockard, "Probe Arrays and Improved Methods for Making and Using Longitudinal Deformation of Probe Preforms" |
| 17/493,802 - Oct. 4, 2021 — — | Li, "Shielded Probes for Semiconductor Testing, Methods for Using, and Methods for Making" |
| 17/507,598 - Oct. 21, 2021 — — | Veeramani, "Probes with Planar Unbiased Spring Elements for Electronic Component Contact and Methods for Making Such Probes" |
| 17/532,959 - Nov. 22, 2021 — | Veeramani, "Pin-Type Probes for Contacting Electronic Circuits and Methods for Making Such Probes" |

Though various portions of this specification have been provided with headers, it is not intended that the headers be used to limit the application of teachings found in one portion of the specification from applying to other portions of the specification. For example, alternatives acknowledged in association with one embodiment, are intended to apply to all embodiments to the extent that the features of the different embodiments make such application functional and do not otherwise contradict or remove all benefits of the adopted embodiment. Various other embodiments of the present invention exist. Some of these embodiments may be based on a combination of the teachings set forth herein with various teachings incorporated herein by reference.

Additional embodiments may be created by combining the teachings of this application with the teachings in one or more applications incorporated by reference herein to produce either embodiments of (1) probes similar to those taught in the incorporated applications but including one or more of the unique features set forth directly in the present application or (2) probes similar to those taught directly in the present application but including one or more of the features set forth in one or more of the incorporated applications to produce enhanced probes.

It is intended that the aspects of the invention set forth herein represent independent invention descriptions which Applicant contemplates as full and complete invention descriptions that Applicant believes may be set forth as independent claims without need of importing additional limitations or elements, from other embodiments or aspects set forth herein, for interpretation or clarification other than when explicitly set forth in such independent claims once written. It is also understood that any variations of the aspects set forth herein represent individual and separate features that may form separate independent claims, be individually added to independent claims, or added as dependent claims to further define an invention being claimed by those respective dependent claims should they be written.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

I claim:

1. A compliant probe for providing an elastic electrical connection between at least two electronic components, the probe comprising:

a) a first planarized layer comprising at least a first structural material;

b) a second planarized layer comprising at least a second structural material, wherein the second structural material has a relationship with the first planarized layer selected from the group consisting of: (1) the second structural material directly adhered to the first planarized layer, (2) the second structural material separated from the first planarized layer by one or more intermediate planarized layers, and (3) the second structural material separated from the first planarized layer by one or more depositions of at least one intervening material;

c) a third planarized layer comprising at least a third structural material, wherein the third structural material has a relationship with the second planarized layer selected from the group consisting of: (1) the third structural material directly adhered to the second planarized layer, (2) the third structural material separated from the second planarized layer by one or more additional intermediate planarized layers, and (3) the third structural material separated from the second planarized layer by one or more depositions of at least one intervening material, wherein the second planarized layer is located between the first and third planarized layers in a layer stacking direction, wherein the second structural material is different from the first structural material and the second structural material is different from the third structural material, wherein at least one of the first to third planarized layers comprises at least one core structural material and at least one shell structural material, wherein at least one of the core structural material and the shell structural material of the at least one of the first to third planarized layers is the respective first to third structural material, wherein the shell structural material and the core structural material are different materials, wherein the core structural material is laterally surrounded by the shell structural material and wherein the core structural material extends at least a portion of the axial length of the probe; and wherein at least one of the first to third planarized layers of the probe comprises a respective first to third structural materials and/or a core structural material that are conductive materials.

2. The probe of claim 1 wherein the probe comprises a layer stack being selected from a group consisting of: (i) one or more layers having a core/shell structure and including one or more cores with one or more shells made of respective core structural material and shell structural material and one or more layers having a no-core/no-shell structure and being made of a same structural material chosen between the first to third structural materials; and (ii) all layers having a core/shell structure and including one or more cores with one or more shells made of respective core structural material and shell structural material.

3. The probe of claim 2 wherein the layer stack comprises at least a no-core/no-shell layer which is adjacent to a core/shell layer in the layer stacking direction and wherein the no-core/no-shell layer is made of a structural material selected from a group consisting of: (i) a core structural material of the core/shell layer; (ii) a shell structural material of the core/shell layer; (iii) a different material than the core structural material and shell structural material of the core/shell layer.

4. The compliant probe of claim 2 wherein the core structural material is also bounded from above and below along the layer stacking direction by a respective one of the first to third structural materials.

5. The compliant probe of claim 1 wherein the at least one core structural material is directly bounded above and below by a respective one of the first to third structural material of an immediately succeeding planarized layer and by an immediately preceding planarized layer, respectively.

6. The compliant probe of claim 1 wherein the at least one core structural material is indirectly bounded by a respective one of the first to third structural materials as the at least one core structural material is separated from the respective one of the first to third structural material by at least one additional layer of core structural material forming part of a planarized layer selected from the group consisting of (1) at least one immediately preceding planarized layer, (2) at least one immediately succeeding planarized layer, and (3) at least one immediately preceding planarized layer and at least one immediately succeeding planarized layer.

7. The probe of claim 1 additionally comprising a tip material located at an end of at least one of the planarized layers, wherein the tip material is different from the first to third structural materials.

8. The probe of claim 1 wherein the first and third structural materials comprise a same structural material.

9. The probe of claim 1 wherein the core structural material comprises a dielectric material.

10. The probe of claim 1 wherein the core structural material comprises a conductive material having a higher conductivity than at least one of the first to third structural materials.

11. The probe of claim 10 wherein the core structural material comprises a conductive material having a higher conductivity than each of the first to third structural materials.

12. The compliant probe of claim 1 wherein the shell structural material on successive planarized layers alternates from layer-to-layer along the layer stacking direction.

13. The compliant probe of claim 1 wherein the core structural material on at least one planarized layer of the first to third planarized layers is the same as the structural material on at least one other planarized layer of the first to third planarized layers of the probe.

14. A multi-layer structure, comprising a layer stack including at least:
a) a first planarized layer comprising at least a first structural material;
b) a second planarized layer comprising at least a second structural material, wherein the second structural material has a relationship with the first planarized layer selected from the group consisting of: (1) the second structural material directly adhered to the first planarized layer, (2) the second structural material separated from the first planarized layer by one or more intermediate planarized layers, and (3) the structural second material separated from the first planarized layer by one or more depositions of at least one intervening material;
c) a third planarized layer comprising at least a third structural material, wherein the third structural material has a relationship with the second planarized layer selected from the group consisting of: (1) the third structural material directly adhered to the second planarized layer, (2) the third structural material separated from the second planarized layer by one or more additional intermediate planarized layers, and (3) the third structural material separated from the second planarized layer by one or more depositions of at least one intervening material,
wherein the second planarized layer is located between the first and third planarized layers in a layer stacking direction,
wherein the second structural material is different from the first structural material and the second structural material is different from the third structural material,
wherein at least one of the first to third planarized layers comprises at least one core structural material and at least one shell structural material, wherein at least one of the core structural material and the shell structural material of at least one of the first to third planarized layers is the respective first to third structural material, wherein the shell structural material and the core structural material are different materials, wherein the core structural material is laterally surrounded by the shell structural material and wherein the core structural material extends at least a portion of the axial length of the structure; and
wherein at least one of the first to third planarized layers of the probe comprises a respective first to third structural materials and/or a core structural material that are conductive materials.

15. The structure of claim 14 wherein the layer stack is selected from a group consisting of: (i) one or more layers having a core/shell structure and including one or more cores with one or more shells made of respective core structural material and shell structural material, and one or more layers having a no-core/no-shell structure and being made of a same structural material chosen between the first to third structural materials; and (ii) all layers having a core/shell structure and including one or more cores with one or more shells made of respective core structural material and shell structural material.

16. The structure of claim 15 wherein the layer stack comprises at least a no-core/no-shell layer which is adjacent to a core/shell layer in the layer stacking direction and wherein the no-core/no-shell layer is made of a structural material selected from a group consisting of: (i) a core structural material of the core/shell layer; (ii) a shell structural material of the core/shell layer; (iii) a different material than the core structural material and shell structural material of the core/shell layer.

17. A method for forming a compliant probe for providing an elastic electrical connection between at least two electronic components, the method comprising:
a) forming a first planarized layer comprising at least a first structural material;
b) forming a second planarized layer comprising at least a second structural material, wherein the second structural material has a relationship with the first planarized layer selected from the group consisting of: (1) the second structural material directly adhered to the first planarized layer, (2) the second structural material separated from the first planarized layer by one or more intermediate planarized layers, and (3) the second structural material separated from the first planarized layer by one or more depositions of at least one intervening material;

c) forming a third planarized layer comprising at least a third structural material, wherein the third structural material has a relationship with the second planarized layer selected from the group consisting of: (1) the third structural material directly adhered to the second planarized layer, (2) the third structural material separated from the second planarized layer by one or more additional intermediate planarized layers, and (3) the third structural material separated from the second planarized layer by one or more depositions of at least one intervening material, wherein the second planarized layer is located between the first and third planarized layers in a layer stacking direction, wherein the second structural material is different from the first structural material and the second structural material is different from the third structural material, wherein forming at least one of the first to third planarized layers comprises forming at least one core structural material and at least one shell structural material, wherein at least one of the core structural material and the shell structural material of the at least one of the first to third planarized layers is the respective first to third structural material, wherein the shell structural material and core structural material are different materials, wherein the core structural material is laterally surrounded by the shell structural material and wherein the core structural material extends at least a portion of the axial length of the probe; and wherein at least one of the first to third planarized layers of the probe comprises a respective first to third structural materials and/or a core structural material that are conductive materials.

18. The method of claim 17, wherein a masked based patterning is used to form the core structural material and the shell structural material as selected from a group consisting of: (i) the core structural material occupies an entire thickness of at least one layer; (ii) the shell structural material surrounds the sides and a bottom of the core structural material but does not provide for a capping of a top of the core structural material; and (iii) the shell structural material surrounds the sides and a top of the core structural material but does not underlie the core structural material.

19. The method of claim 17, wherein the probe is formed with more than one layer having a core/shell structure formed by at least one core structural material and at least one shell structural material.

20. The method of claim 19, wherein the core structural materials is formed by different layers in contact one another.

* * * * *